(12) United States Patent
Hurtado et al.

(10) Patent No.: US 10,224,831 B1
(45) Date of Patent: Mar. 5, 2019

(54) CONTROL SYSTEMS, METHODS, AND SOFTWARE FOR KEEPING POWER CONVERTERS WITHIN OPERATING LIMITS DURING DISTURBANCES

(71) Applicant: Northern Power Systems, Inc., Barre, VT (US)

(72) Inventors: Hector H. Hurtado, Montpelier, VT (US); Stephen P. Hoskins, Waterbury Center, VT (US); Jeffrey K. Petter, Williston, VT (US)

(73) Assignee: Northern Power Systems, Inc., Barre, VT (US)

( * ) Notice: Subject to any disclaimer, the term of this patent is extended or adjusted under 35 U.S.C. 154(b) by 0 days.

(21) Appl. No.: 15/876,590

(22) Filed: Jan. 22, 2018

(51) Int. Cl.
| | | |
|---|---|---|
| *H02M 7/493* | (2007.01) | |
| *H02J 3/46* | (2006.01) | |
| *H03K 17/042* | (2006.01) | |

(52) U.S. Cl.
CPC ............. *H02M 7/493* (2013.01); *H02J 3/46* (2013.01); *H03K 17/042* (2013.01)

(58) Field of Classification Search
CPC ......... H02M 7/493; H02J 3/46; H03K 17/042
See application file for complete search history.

(56) References Cited

U.S. PATENT DOCUMENTS

| | | | |
|---|---|---|---|
| 2,821,639 A | 1/1958 | Bright et al. | |
| 5,041,957 A | 8/1991 | Dhyanchand et al. | |
| 5,047,909 A | 9/1991 | Hosoda | |
| 5,070,440 A | 12/1991 | Walker | |
| 5,091,840 A | 2/1992 | Walker | |
| 5,191,519 A | 3/1993 | Kawakami | |
| 5,289,046 A | 2/1994 | Gregorich et al. | |
| 5,631,503 A | 5/1997 | Cioffi | |
| 5,745,356 A | 4/1998 | Tassitino, Jr. et al. | |
| 6,118,680 A | 9/2000 | Wallace et al. | |
| 6,249,447 B1 * | 6/2001 | Boylan .............. | G01R 19/0092 |
| | | | 363/131 |
| 6,356,471 B1 | 3/2002 | Fang | |
| 6,459,601 B1 | 10/2002 | Oba | |
| 6,693,409 B2 | 2/2004 | Lynch et al. | |
| 7,145,266 B2 * | 12/2006 | Lynch ....................... | H02J 3/18 |
| | | | 307/65 |
| 7,502,697 B2 * | 3/2009 | Holmquist ............. | G05B 11/28 |
| | | | 702/60 |

(Continued)

*Primary Examiner* — Emily P Pham
(74) *Attorney, Agent, or Firm* — Downs Rochlin Martin PLLC

(57) ABSTRACT

Feedback-type control systems for power converters that assist the power converters in staying within operational limited during disturbances. In some embodiments, each control system includes an impedance current regulator controlled as a function of an error between a measured feedback voltage signal representing the output of the power converter and an active feedforward voltage signal. In some multiphase embodiments, the impedance current regulator includes a gain that is adjusted as a function of the level of phase imbalance among the multiple phases. In some multiphase embodiments, a total current limit is determined as a function of the level of phase imbalance among the multiple phases. Corresponding feedback control methods and software, as well as power converter systems and AC network systems incorporating such feedback control systems, are also disclosed.

30 Claims, 24 Drawing Sheets

(56) References Cited

U.S. PATENT DOCUMENTS

| | | | | |
|---|---|---|---|---|
| 8,780,595 B2* | 7/2014 | Larsen | ................. | H02J 3/1842 363/121 |
| 2008/0205096 A1* | 8/2008 | Lai | ........................ | H02J 3/38 363/40 |
| 2015/0372622 A1* | 12/2015 | Ortiz | ....................... | H02P 3/14 318/376 |
| 2016/0105093 A1* | 4/2016 | Della Flora | ........... | G05B 11/28 702/60 |

\* cited by examiner

CONTROL SYSTEMS, METHODS, AND SOFTWARE FOR KEEPING POWER CONVERTERS WITHIN OPERATING LIMITS DURING DISTURBANCES

FIELD OF THE INVENTION

The present invention generally relates to the field of DC to AC power converters. In particular, the present invention is directed to control systems, methods, and software for keeping power converters within operating limits during disturbances.

BACKGROUND

There are many types of distributed generation (DG) and energy storage devices being developed and used throughout the world. These include: fuel cells; flywheels; advanced batteries; micro-turbines; Stirling engines; wind turbines; solar cells; and double layer capacitors. Each one of these devices requires a power electronic inverter at its output to make useful AC power. Typically, this is 50 or 60 Hz single or three-phase power.

A number of techniques are described in patents and literature for connecting these devices to each other and to a utility grid. Many of these techniques involve using parallel power converters that fall into two categories, one in which devices are paralleled on the DC side of the converter and the other in which devices are paralleled on the AC side of the converter.

The concept of paralleling devices on the DC side permits the use of one large inverter, thereby reducing inverter costs. This motivation for paralleling devices on the DC side is less significant today than in the past, since the cost of controls for multiple inverter systems has decreased significantly. For a larger system, the DC-side technique uses a DC distribution system with each distributed generator supplying DC power to the DC distribution system and each load having its own inverter. In this system, a single inverter failure will cause loss of load.

Paralleling devices on the AC side is inherently more reliable, since the loads are AC. No single device failure need drop the AC power to loads as long as there is some excess capacity.

The typical method used to connect a number of power electronics units in parallel is to make one master and the rest slaves. The master is a voltage source and the slaves are current sources. This method works well if the loads are linear, have no quick surges, and draw only real power. When all of these characteristics are not present, problems can arise. These problems can be overcome to some extent through the use of high bandwidth control systems between the paralleled inverters. However, these control systems are not generally applicable for large or disperse systems. In addition, the high speed communication needed between inverters in parallel causes a single point failure issue for parallel redundant power systems and thus makes the master/slave method less reliable.

Equipment has been developed for load sharing between parallel inverters in AC power systems without the use of control circuitry connected to the inverters. Examples of such systems are described in U.S. Pat. No. 5,745,356 to Tassitino, Jr. et al. and U.S. Pat. No. 6,118,680 to Wallace et al. The information needed for load sharing is obtained from the output of each inverter in these systems. The output of each inverter is adjusted based on this information so that all of the inverters in the system equally share the load. Unfortunately, these systems are not believed to share current harmonics and transients, nor do these apparently share reactive current.

U.S. Pat. No. 6,693,409 to Lynch et al. discloses power converter control systems that are well-adapted to overcome shortcomings noted above. In a number of embodiments of the Lynch et al. patent, which are also described in detail in the Detailed Description section, the power converter control system includes an impedance current regulator (106) that includes a difference unit (102) that determines a voltage error between a feedback voltage from the output side of the power converter and a voltage signal that is a product of a reference AC voltage command signal (from source 60) and a sine waveform from a phase-locked loop (80). However, under substantially balanced voltage sags/swells during steady-state or transient operation, the voltage error that drives the impedance current regulator term in those systems can be significant and contribute excessive currents if the amplitude of the feedforward signal does not match the amplitude of the voltage feedback. This can lead to power converter control signals that are outside the operational limits of the power converters.

SUMMARY OF THE DISCLOSURE

In one implementation, the present disclosure is directed to a control system for a controlled current source that receives DC power as an energy input and provides an AC power output for delivery to an AC power network, the AC power output having an output voltage. The control system includes a voltage signal device, connectable to the controlled current source, configured to provide a voltage feedback signal representing voltage in the AC power output from the controlled current source; an active feedforward loop electrically connected to the voltage signal device, the active feedforward loop configured to generate an active feedforward voltage signal based on the voltage feedback signal; and an impedance current regulator configured to generate an impedance current signal as a function of an error between the voltage feedback signal and the active feedforward voltage signal.

In another implementation, the present disclosure is directed to a method of controlling a controlled current source that receives DC power as an energy input and provides an AC power output for delivery to an AC power network, the AC power output having an output voltage. The method includes receiving a voltage feedback signal representing voltage in the AC power output from the controlled current source; generating an active feedforward voltage signal based on the voltage feedback signal; determining an error between the voltage feedback signal and the active feedforward voltage signal; generating an impedance current signal as a function of the error between the voltage feedback signal and the active feedforward voltage signal; and controlling the controlled current source as a function of the impedance current signal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 5-1 and 5-2 together contain a schematic diagram of a prior-art control system similar to the one shown in FIG. 1, except that it includes a modification to the impedance current regulator;

FIGS. 10-1, 10-2 and 10-3 together contain a schematic diagram of a 3-phase, 4-wire, version of the power converter illustrated in FIG. 1;

FIGS. 11-1, 11-2 and 11-3 together contain a schematic diagram of a prior-art control system similar to the one shown in FIGS. 10-1, 10-2 and 10-3, except that it is intended for use with a 3-phase, 3-wire, power converter;

DETAILED DESCRIPTION

In some aspects, the present disclosure is directed to feedback-based control systems for power converters that aid the power converters in handling disturbances that can occur during operation. Examples of power converters with which control systems of the present disclosure can be used appear in U.S. Pat. No. 6,693,409 to Lynch et al. titled "CONTROL SYSTEM FOR A POWER CONVERTER AND METHOD OF CONTROLLING OPERATION OF A POWER CONVERTER" ("the '409 patent"), the detailed description of which is largely reproduced below. Details and examples of feedback-based control systems of the present disclosure are described below in the section titled "FEEDBACK-BASED CONTROL SYSTEMS". Prior to reading that section, the reader should review and understand the following descriptions leading up to that section. In other aspects, the present disclosure is directed to power converter systems that include such feedback-based control systems, methods of providing the feedback control, and software for executing the feedback control methods.

Figure 1:
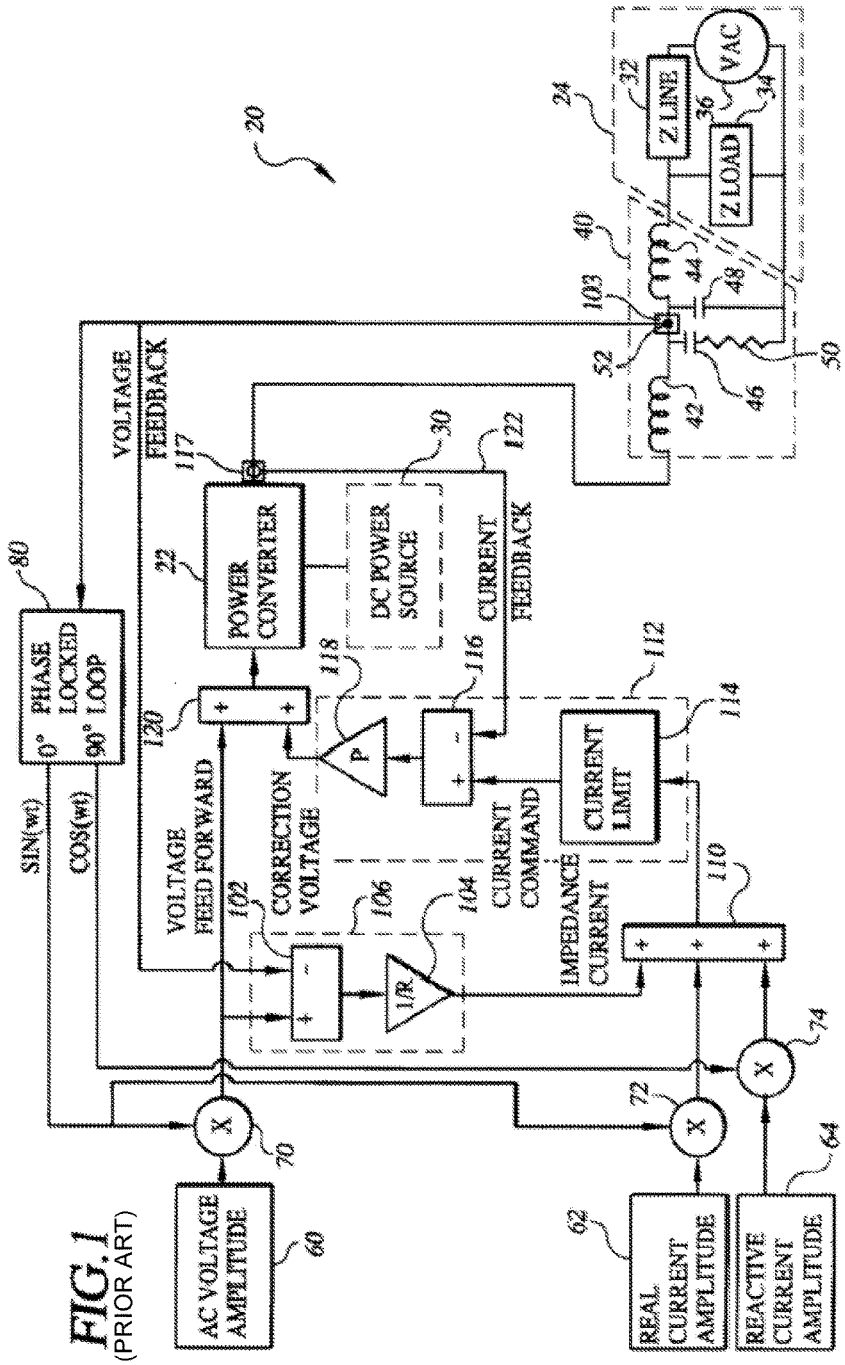
FIG. 1 is a schematic diagram of a prior-art power converter control system.

Referring now to the drawings, FIG. 1 illustrates a prior art control system 20 designed for connecting a power converter 22 to an AC power network 24, and for controlling the power converter. A control system of the present disclosure, such as control system 20, makes it possible to connect any number of power converters 22 in parallel to the same AC power network 24 without the need for a separate control system connected to the multiple power converters 22. AC power network 24 can be a conventional utility grid or an isolated power network. System 20 works for both single and three-phase systems.

System 20 is connected between a DC power source 30, such as a battery, flywheel, photovoltaic panel, or fuel cell, and AC power network 24. In particular, DC power source 30 is connected so that the power it generates is provided to power converter 22.

Power converter 22 may comprise any conventional converter for converting DC power to AC power, e.g., converters of the type described in U.S. Pat. Nos. 2,821,639 and 5,191,519, which are incorporated herein by reference. Power converter 22 can be thought of as an ideal unity gain amplifier. Indeed, any device that can follow a waveform is encompassed by power converter 22.

In one embodiment, power converter 22 may be a switching power converter half bridge (not shown) with a pulse width modulation (PWM) control (not shown) and compensation (not shown) to linearize the output. The compensation is typically dead-time compensation and DC input voltage feed forward if needed. Dead-time compensation is a small fixed offset to each PWM input signal. The offset is either positive or negative depending on the polarity of the output current. The amplitude of the offset is proportional to the ratio of the switch dead time to the switching period. Dead-time compensation is provided to account for momentary loss of voltage control during switching. DC voltage compensation is performed by dividing the signal going to the PWM, before it goes to the dead time compensation, by the value of the actual DC voltage divided by the nominal DC voltage. This makes the gain of the power converter independent of the DC voltage. This may not be needed if the DC input is well controlled.

In other embodiments, power converter 22 may be an inverter. Suitable inverters include all types of PWM or resonant inverters, single phase and multi-phase; indeed any power inverter for making AC power, which can follow a reference waveform like an amplifier or a motor drive.

AC power network 24 is represented schematically by line impedance 32, load impedance 34 and the effective EMF 36 of the AC power network. Load impedance 34 is the impedance associated with the load supplied by system 20 and line impedance 32 is the impedance otherwise present on AC power network 24. Load impedance 34 can be very dynamic and is often non-linear and reactive. Line impedance 32 is less dynamic and is typically very inductive. Effective EMF 36 is typically a sine wave with a fundamental frequency of 50 or 60 Hz within +/−10% of the expected voltage and can have up to a few percent harmonic distortion, typically at odd harmonics of the fundamental frequency. AC power network 24 is the environment with which system 20 is used and is part of the present disclosure only in its broadest definition. AC power network 24 may be a utility grid or an isolated power network.

System 20 may include a filter 40 connected between the output of power converter 22 and AC power network 24. In one embodiment, filter 40 is a damped LCL tee filter including inductors 42 and 44 connected in series with one another and between power converter 22 and line impedance 32. Filter 40 also includes capacitors 46 and 48 connected in parallel with one another and in parallel with load impedance 34, and resistor 50 connected in series with capacitor 46. Capacitors 46 and 48 are connected at the tee point 52 of filter 40 between inductors 42 and 44.

This embodiment of filter 40 provides ripple filtering from power converter 22 and provides impedance for controlling the power converter current. This embodiment of filter 40 also provides some high frequency isolation for other elements of system 20 so that the loads on AC power network 24 do not have a large effect on the stability of the system. In this embodiment, the inductors are about 5% impedance (5% of the rated voltage divide by the rated current at 60 Hz) and the corner frequency of filter 40 is about 3 kHz and the Q is about 4. In some cases, it may be desirable to omit filter 40 from system 20, and the present disclosure encompasses other filters known to those skilled in the art. In any event, attributes of the AC power at tee point 52 is influenced by line impedance 32, load impedance 34 and effective EMF 36 by virtue of the placement of filter 40 between the output of power converter 22 and AC power network 24.

System 20 also includes a source 60 for a reference AC voltage command signal, a source for a real current command signal 62 and a source for a reactive current command signal 64. The reference AC voltage command signal provided by source 60 is a voltage amplitude. The real current command signal from source 62 is a current amplitude and the reactive current command signal from source 64 is also a current amplitude. Unit sine and cosine waveforms are multiplied by the voltage and current amplitude signals from sources 60, 62 and 64, as described below. The output from these sources is provided, respectively, at multipliers 70, 72 and 74. A phase locked loop (PLL) 80 is preferably included in system 20. PLL 80 generates a direct (sine) and quadrature (cosine) wave exactly in phase with the voltage at the tee point 52 of filter 40, which is provided as an input to the PLL via line 82. These two waveforms are preferably very pure sine waves that are exactly phase locked to the incoming signals. Any one of a variety of phase locked loops known to those skilled in the art may be used as PLL 80.

Figure 2:
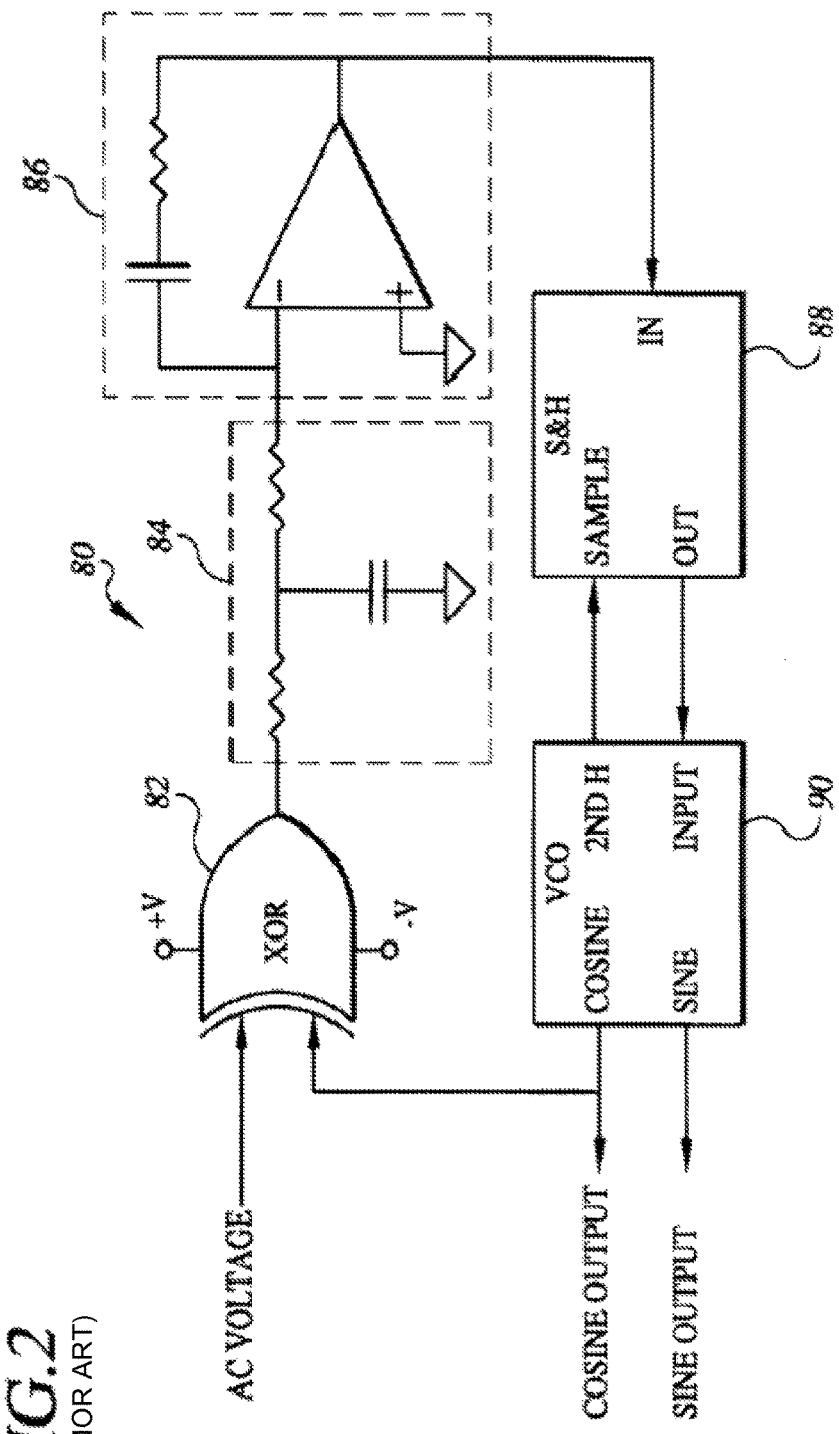
FIG. 2 is a schematic diagram of a prior-art phase locked loop that may be used in the system of FIG. 1.

One phase locked loop that may be used as PLL 80 is illustrated in FIG. 2. The phase detector in this PLL is XOR gate 82. This implementation of PLL 80 also includes a loop filter 84, e.g., a 10 Hz single low-pass filter, though which the output of XOR gate 82 is filtered. The output of filter 84 is provided to an integrator 86 with a zero at 0.1 Hz. PLL 80 also has a sample and hold circuit 88 that receives as its input the output of integrator 86. PLL 80 further includes a voltage-controlled oscillator (VCO) 90 connected to receive the output of sample and hold circuit 88. VCO 90 generates as outputs two waveforms, a cosine waveform and a sine waveform. VCO 90 further generates a second harmonic of its frequency, which is provided as a sample input to sample and hold circuit 88. The latter samples the output of integrator 86 as a function of the second harmonic input.

The cosine wave from VCO 90 is fed to XOR circuit 82 for comparison with the input voltage waveform taken at tee point 52. In addition, the cosine waveform is provided to multiplier 70, where it is multiplied by the reference voltage amplitude signal provided by source 60. The sine waveform from PLL 80 is fed to multiplier 72, where it is multiplied by the real current amplitude signal provided by source 62, and to multiplier 74, where it is multiplied by the reactive current amplitude signal provided by source 64.

The gain of VCO loop gain 90 is chosen so that the open loop gain bandwidth product at about 1 Hz is 1. This makes a second order PLL with a closed loop bandwidth of 1 Hz and a tracking second harmonic notch filter for very pure output waveform. The second order feature is used to force the phase error to zero at all frequencies. A second order PLL is not required for system 20; it simply is a good way to achieve a very low phase error.

System 20 also includes a difference unit 102 connected to receive as inputs a voltage signal representing the voltage at tee point 52 and the reference voltage signal provided by voltage source 60. A voltage signal device 103, that includes known elements not shown such as A/D converters, scaling devices and other equipment, receives the actual output voltage from power converter 22 and then develops the voltage feedback signal provided to difference unit 102 based on the actual output voltage. Difference unit 102 determines the voltage difference between the reference AC voltage signal and the voltage feedback signal and provides this difference to gain 104 as a voltage difference signal. Together, difference unit 102 and gain 104 make up an impedance current regulator 106.

Gain 104 provides a 1/R gain, where R is an effective real output resistance. R is determined by dividing the rated output voltage of power converter 22 by the rated output current of the power converter and multiplying the result by 0.02 to 0.2, depending upon desired performance, attributes of AC power network 24 and other factors known to those skilled in the art. For good performance in a typical AC power network 24, R is typically about 0.05 times the rated output voltage divided by the rated output current. The output of gain 104 is an impedance current signal.

System 20 further includes a summing unit 110. The latter is connected to receive as its inputs the impedance current signal from gain 104, the real current signal from source 62 and the reactive current signal from source 64. Summing unit 110 sums these three current signals to develop a resultant current signal. In some instances, it may be useful to consider summing unit 110 as part of impedance current regulator 106, although it is not so indicated in the drawings.

A correction voltage unit 112 is included in system 20. Unit 112 includes a current limit 114 for receiving the resultant current signal from summing unit 110 and then limiting the current it provides as an output so as to protect power converter 22 from an over-current condition. Correction voltage unit 112 also includes a difference unit 116, which receives as one input the limited current signal from current limit 114. The other current input signal to difference unit 116 is an output current signal representing the output current from power converter 22, before filter 40. This signal is developed by current signal device 117 that includes known elements such as A/D converters, scaling devices and other equipment not shown in the drawings. Difference unit 116 determines the difference between these current signals and then provides a current difference signal to gain 118. The output from gain 118 is a correction voltage signal provided to voltage summing unit 120. The correction voltage and the feed forward voltage signal provided from multiplier 70 is combined at summing unit 120 and provided as a control voltage input signal, also referred to herein as a voltage command signal, to power converter 22. Although voltage correction unit 112 is shown in FIG. 1 as not including summing unit 120, it is useful in some cases to consider the summing unit as part of the voltage correction unit.

Gain 118 is used to control the bandwidth of the current control loop made up of difference unit 116, gain 118, summing unit 120, power converter 22 and the line 122 connecting providing the current feedback signal from device 117 to difference unit 116. Suitable performance of system 20 is obtained when this bandwidth is set between 1 and 2 kHz, although other frequencies may be desirable for certain applications, as those skilled in the art will appreciate. The specific gain P provided by gain 118 depends on the desired bandwidth B, the inductance of filter 40, and the voltage gain G of power converter 22 including scaling factors in the voltage sensing circuits (not shown) responsible for generating the voltage feedback from tee point 52. Gain G typically has a value near 1. In other words this gain G is simply the signal level gain from the input of the power converter 22 back to tee point 52. Thus, the gain parameter P is $2*\pi*B*L*/G$, where B is the desired bandwidth and L is the inductance of filter 40

Figure 3:
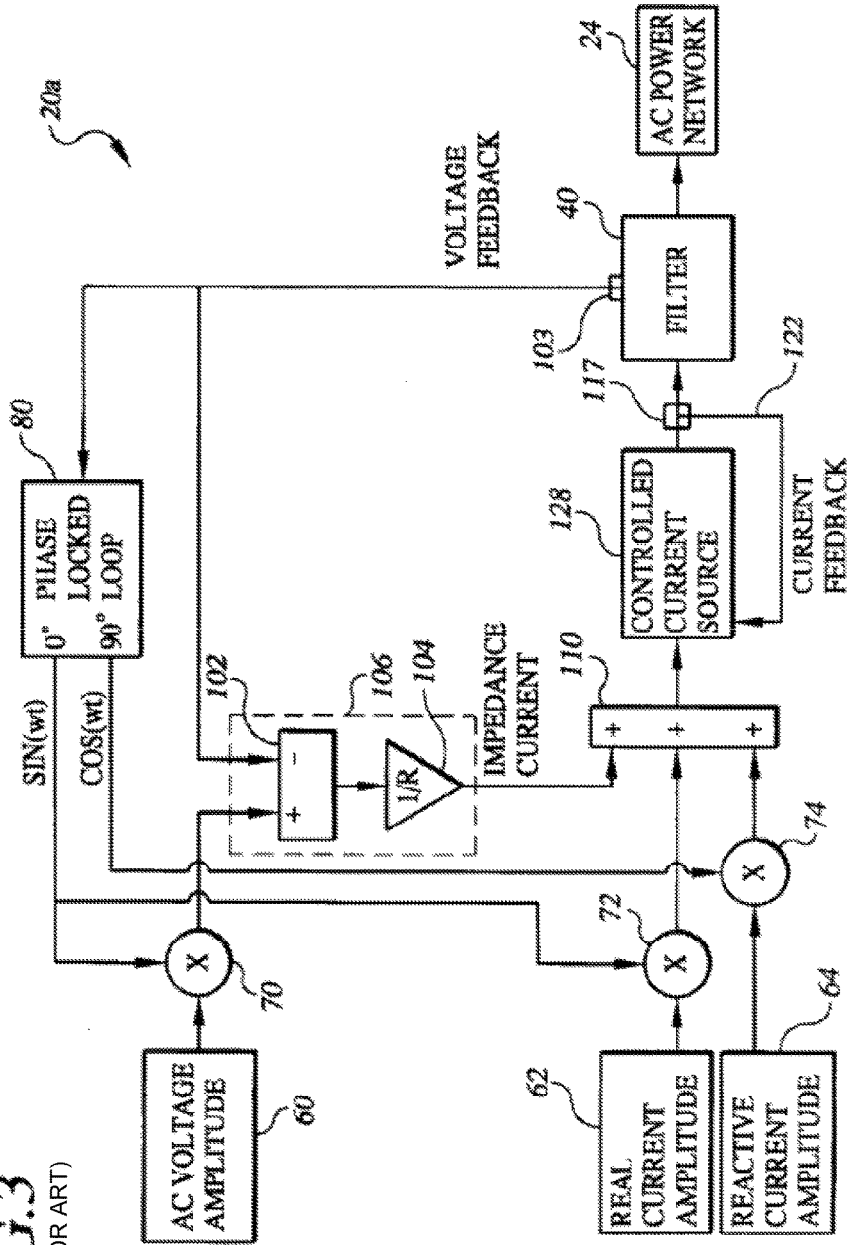
FIG. 3 is a schematic diagram illustrating a more generalized version of the prior-art control system illustrated in FIG. 1.

A simplified version of system 20, illustrated in FIG. 3 and identified as system 20*a*, emphasizes the important impedance current regulation aspect of the present disclosure. System 20*a* is similar to system 20, with like elements having like numbers. System 20*a* includes a controlled current source 128 for providing controlled AC power. Current source 128 takes the place of, and performs the same functions as, power converter 22, DC power source 30, correction voltage unit 112 and summing unit 120. It is to be appreciated, however, that controlled current source 128 is intended to represent a generalized controlled current source, and so encompasses a variety of implementations and is not limited to just a mere combination of elements in system 20.

The resultant current signal from summing unit 110 is provided to controlled current source 128. There, after determining a difference relative to a current feedback signal representing the current output of the power converter 22, and applying gain P to the current difference, a correction voltage signal is generated. As discussed above, this correction voltage signal is combined with the reference AC voltage signal to create a voltage control signal for power converter 22 in controlled current source 128. The output from controlled current source 128 is provided through filter 40 to AC power network 24.

The various elements making up system 20, with the exception of power converter 22, are typically implemented in software or firmware within a controller connected to the power converter and AC power network 24. Thus, in a typical implementation of system 20 discrete circuit elements or devices are not used. The present disclosure, however, encompasses implementation of a control system in just software or firmware (with associated equipment to provide the necessary current and voltage feedback signals from the output of power converter 22) and also as discrete circuit elements and devices.

Discussing now the operation of some embodiments of a control system of the present disclosure, with reference to system 20 (FIG. 1) and system 20*a* (FIG. 3), AC energy is provided from controlled current source 128 through filter 40 to AC power network 24. Impedance current regulator 106 influences the real and reactive current provided by controlled current source 128 based on the ability of AC power network 24 to absorb current changes from controlled current source 128. In this regard, the impedance current signal provided by regulator 106 is combined with real and reactive current signals from sources 62 and 64, respectively, so as to ultimately modify the real and reactive currents in the AC power provided by controlled current source 128.

The impedance current signal provided by impedance current regulator 106 is influenced by (i) line impedance 32, load impedance 34 and effective EMF 36 in AC power network 24, and by (ii) characteristics of the output power from controlled current source 128. This influence on the impedance current signal occurs by virtue of the voltage feedback signal from tee point 52 in filter 40 being provided to difference unit 102 in current regulator 106 and by virtue of the current feedback signal from the output power of power converter 22, before, filter 40 being provided to difference unit 116. As concerns the voltage feedback signal, the impedance current signal provided to summing unit 110 is based on the difference between the feedback voltage signal from tee point 52 and a reference voltage signal from source 60 (with its sine wave controlled via the output of PLL 80), as developed within current regulator 106. Thus, the voltage signal input to gain 104, which ultimately influences the output of controlled current source 128, is based on the prevailing voltage on AC power network 24 and a reference voltage amplitude (from source 60), the sine waveform of which has been controlled by PLL 80 relative to the sine waveform of the AC power at tee point 52. As concerns the current feedback signal on line 122, the difference between such signal and the resultant current command signal from summing unit 110, as determined at difference unit 116, ensures that the voltage control signal provided to the power converter is influenced in part by the current in the AC output power from power converter 22.

The amount of impedance current correction is controlled by the value of the gain in gain unit 104 (1/R). This gain is represented by 1/R because the value of R represents an effective output resistance of power converter 22. In other words this gain controls the number of amps that power converter 22 provides for each volt of difference between the reference voltage from source 60 and the voltage feedback signal from tee point 52.

Gain P provided by gain 118 is selected, in part, as a function of the desired bandwidth of the current control loop, as noted above. A bandwidth in the range of 1 to 2 kHz is typical, although implementations are not so limited. The capability of system 20 will be limited by the DC power source 30 behind it. In many cases, DC power source 30 will only be able to provide positive power and the level of power will only change slowly. In other cases, the DC power source 30 will only have a limited amount of energy storage.

The power level of this energy storage can change quickly but must be recharged after use. While performing its function of supplying power to or from AC power network 24, system 20 is simply a bi-directional DC to AC power converter that takes into account the AC system needs.

The resultant current signal provided by summing unit 110 to controlled current source 128 is created as a function of the amplitude of the real current signal from source 62 and the sine waveform imposed by PLL 80. This real current signal is used to control the real power flow from a specific DC power source relative to other equipment connected to AC power network 24. The real current signal may be either positive or negative. Negative values are used to recharge sources with energy storage capability.

The reactive current signal provided by summing unit 110 to controlled current source 128 is created as a function of the amplitude of the reactive current signal from source 64 and the cosine waveform imposed by PLL 80. This reactive current signal is used to control the reactive power flow relative to other equipment connected to AC power network 24. The reactive current command signal can be used to control the power factor of the output current from power converter 22 to compensate for a load or provide reactive power to an AC power network 24. The cosine waveform of the reactive current signal is 90 degrees out of phase with the sine waveform generated from real current command source 62, and may be either positive or negative.

The three input parameters to system 20 from sources 60, 62 or 64 can be controlled within system 20 or based on external commands. It should be noted that the control provided by system 20 does not permit power converter 22 to track exactly the command signals from these three sources. It cannot because it must also respond to the local voltage and impedance of AC power network 24. This characteristic of system 20 occurs due to the use of impedance current from impedance current regulator 106, as discussed above. System 20 uses the output voltage signal from tee point 52 to modify the current command, and in particular the impedance current signal, so that the output voltage does not get too far out of range. Since the impedance regulation is performed in a high-speed real-time routine, in the case of a fault the voltage recovers quickly without much overshoot to the normal value once the fault is cleared. Similarly, voltage surges are supported and other equipment is not disturbed.

Figure 4:
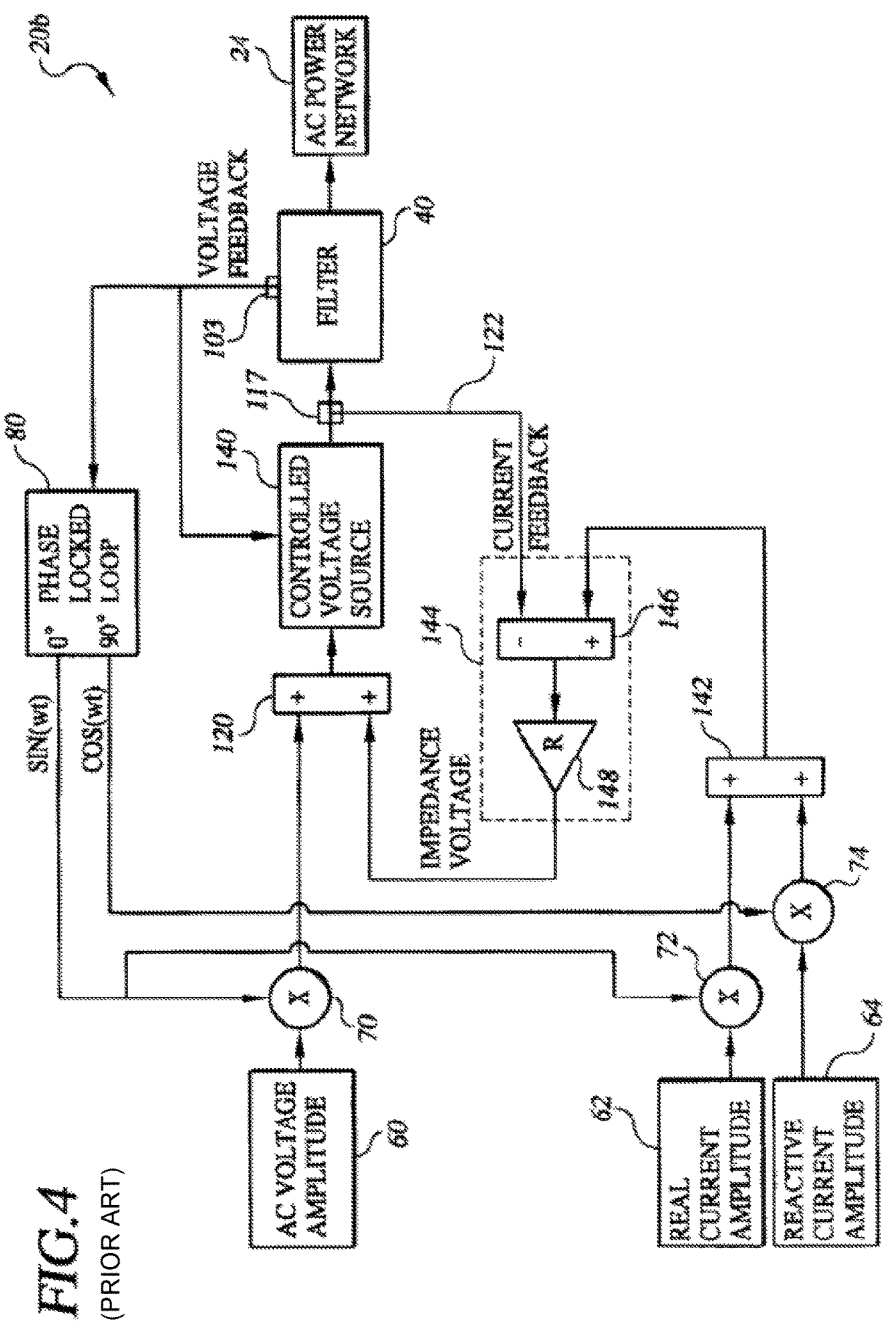
FIG. 4 is a schematic diagram of a prior-art control system similar to the one shown in FIG. 3, except that the voltage feedback loop is positioned within the current feedback loop.

Referring to FIGS. 3 and 4, in system 20 and 20a the current control loop is positioned inside the voltage control loop with a specific gain 1/R. Another embodiment includes turning the control loops inside out, as illustrated relative to prior-art system 20b in FIG. 4. Where system 20b is identical to system 20a, common elements are identically numbered. An important difference, however, is that controlled voltage source 140 is used in place of controlled current source 128. Controlled voltage source 140 is similar to controlled current source 128, except that the input control signal is a voltage signal instead of a current signal.

Another difference between systems 20a and 20b is that impedance current regulator 106 is not included, nor is summing unit 110. Real and reactive current command signals from sources 62 and 64, respectively, are combined in summing unit 142 and are provided as a summed current signal to impedance current regulator 144. The latter includes a difference unit 146 for generating a difference signal representing the difference between the summed current signal from summing unit 142 and a current feedback signal from device 117 representing the output current of the AC power output of the power converter 22 (not shown) in controlled voltage source 140. This feedback current can be considered the impedance current used in controlling controlled voltage source 140. Impedance current regulator 144 also includes a gain unit 148 that applies a gain R to the difference signal from difference unit 146. A gain R, rather than a gain 1/R, is used in gain 148 because the input to gain 148 is a current rather than a voltage. The value of R is discussed above in connection with the discussion of system 20. Although not shown, a current limit similar to current limit 112 is preferably included in system 20b for limiting the summed current from summing unit 142.

In operation, the control method provided by system 20b is reasonably equivalent to that of system 20a, as discussed above. The only notable differences are (1) there is no simple place to add a current limiting function; and (2) with the voltage loop on the inside of the current loop, the voltage transient response will be faster than the current response.

Figures 1, 5:
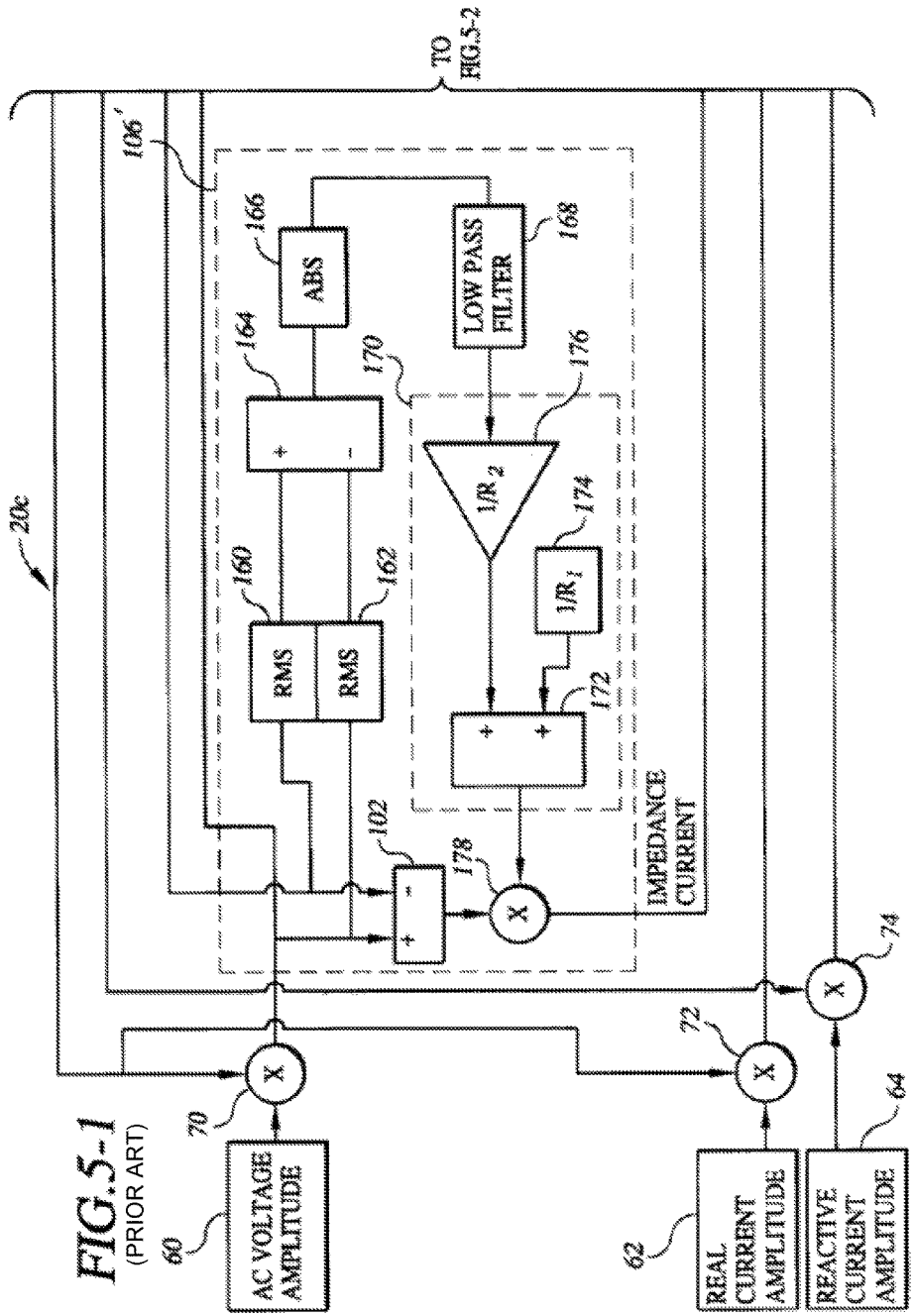
Figures 2, 5:
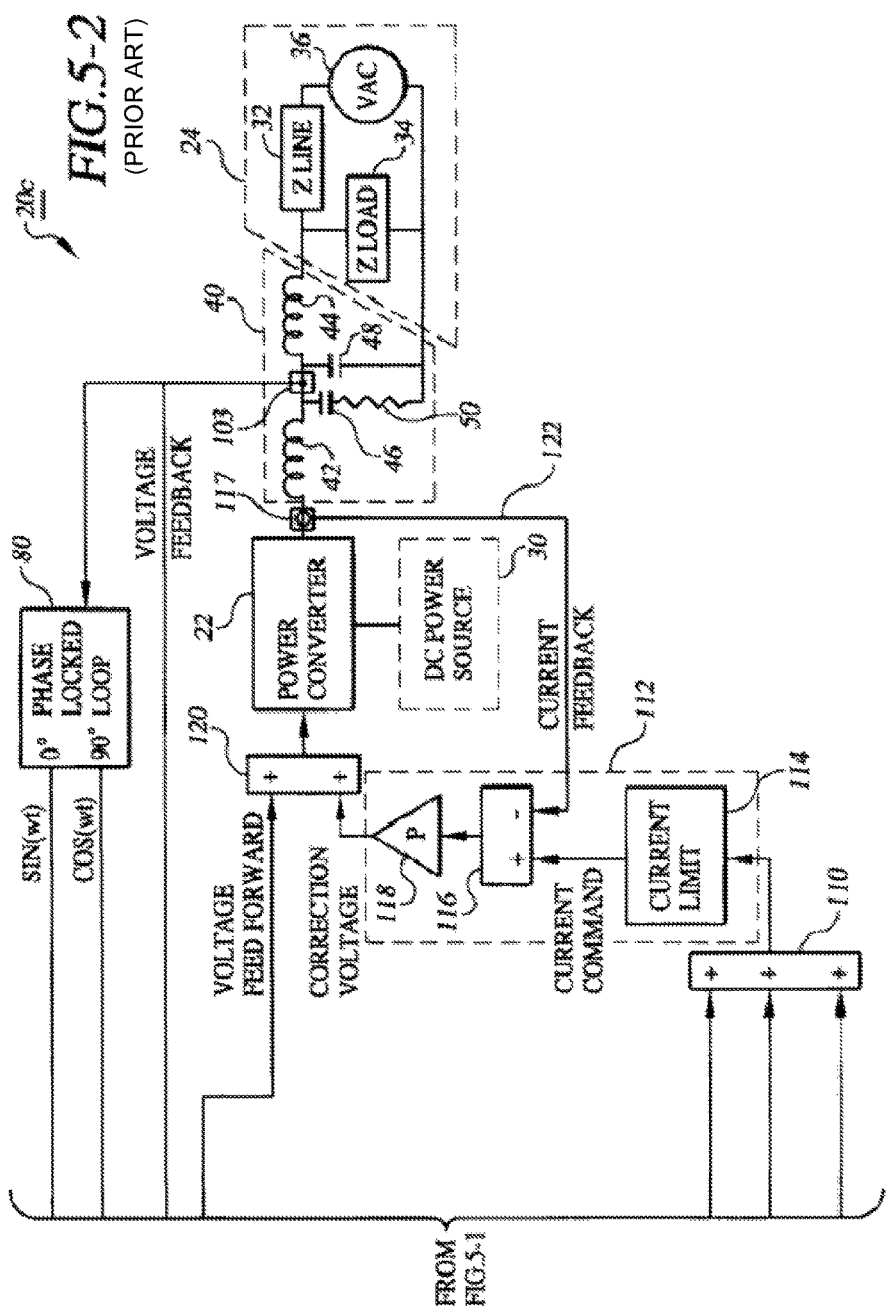

Turning now to FIGS. 5-1 and 5-2, in another prior-art embodiment, identified as system 20c, impedance current regulator 106 of system 20 is replaced with impedance current regulator 106'. Otherwise, system 20c is identical to system 20.

Impedance current regulator 106' includes RMS unit 160 connected to receive the voltage feedback signal from tee point 52 of filter 40, and RMS unit 162 connected to receive the feed forward reference AC voltage from multiplier 70. RMS units 160 and 162 determine the root mean square value of the voltage signals they receive and provide RMS voltage signals as output.

Impedance current regulator 106' also includes a difference unit 164 for determining the difference between the RMS voltage signals provided as inputs thereto. Difference unit 164 generates a difference signal representing this difference in the RMS voltage signals and provides it to ABS unit 166. The latter takes the absolute value of the difference signal and provides the result to low pass filter 168, which filters the difference to provide the desired response time to the RMS difference signal. The filtered voltage difference signal is then provided to gain unit 170, which applies a gain function to the filtered difference signal from filter 168. In one embodiment, gain unit 170 includes a summing unit 172 and a gain 174 that provides 1/R1 gain signal to the summing unit. Gain unit 170 further includes a gain 176 that imposes a 1/R2 gain on the filtered voltage difference signal from filter 168, and provides the result to summing unit 172. The latter combines the 1/R1 signal with the voltage difference signal with the 1/R2 gain to develop an impedance current signal that is provided to multiplier 178.

There, the impedance current signal is combined with the voltage difference signal from difference unit 102 and is provided to summing unit 110. As described above relative to system 20, the resultant current signal provided by summing unit 110 is provided to current limit 114 in voltage correction unit 114.

Gain unit 170 has been described above as including a specific set of elements for accomplishing a particular function. Gain unit 170 may perform other functions, and so the present disclosure is not limited to the specific functions accomplished by the embodiment of the gain unit described above, nor the specific elements included in such embodiment.

In operation, system 20c increases the value of the 1/R gain applied to the output of difference unit 102 linearly with the difference of the RMS values of the voltage feed forward signal and the voltage feedback signal from RMS units 160 and 162, respectively. The control method of system 20c produces a response that will provide proportionally lower impedance (more restoring current) as the AC voltage at tee point 52 deviates from the nominal AC voltage. The effective value of 1/R will be $1/R_1+[rms(V_{ff})-rms(V_{fb})]/R_2$ where $V_{ff}$ is the voltage feed forward signal from multiplier 70 and $V_{fb}$ is the voltage feedback signal from tee point 52. The filtering lets the voltage feedback deviate for short term (within a line cycle) without a significant response from this term of the control circuit. If, however, the voltage changes for longer times system 20c will provide a stronger restoring current. This would allow a small correction for harmonics while providing a larger correction for fundamental voltage differences. This is useful in a system that has a large harmonic load in which harmonic correction is not required.

The value of $R_2+R_1$ should be on the order of 3% to 10%, typically about 5% of the rated output voltage of power converter 22 divided by its rated output current, with $R_2$ roughly equal to $R_1$. The exact opposite response may be desired for some applications. In this case the value of $R_2$ would be negative. This would provide for a large correction for harmonics and a smaller correction for the fundamental voltage. This would be useful in a harmonic filter application that has little of no energy storage. The value of $R_2$ in this case would have a magnitude less than $R_1$, but with a negative sign.

Figure 6:
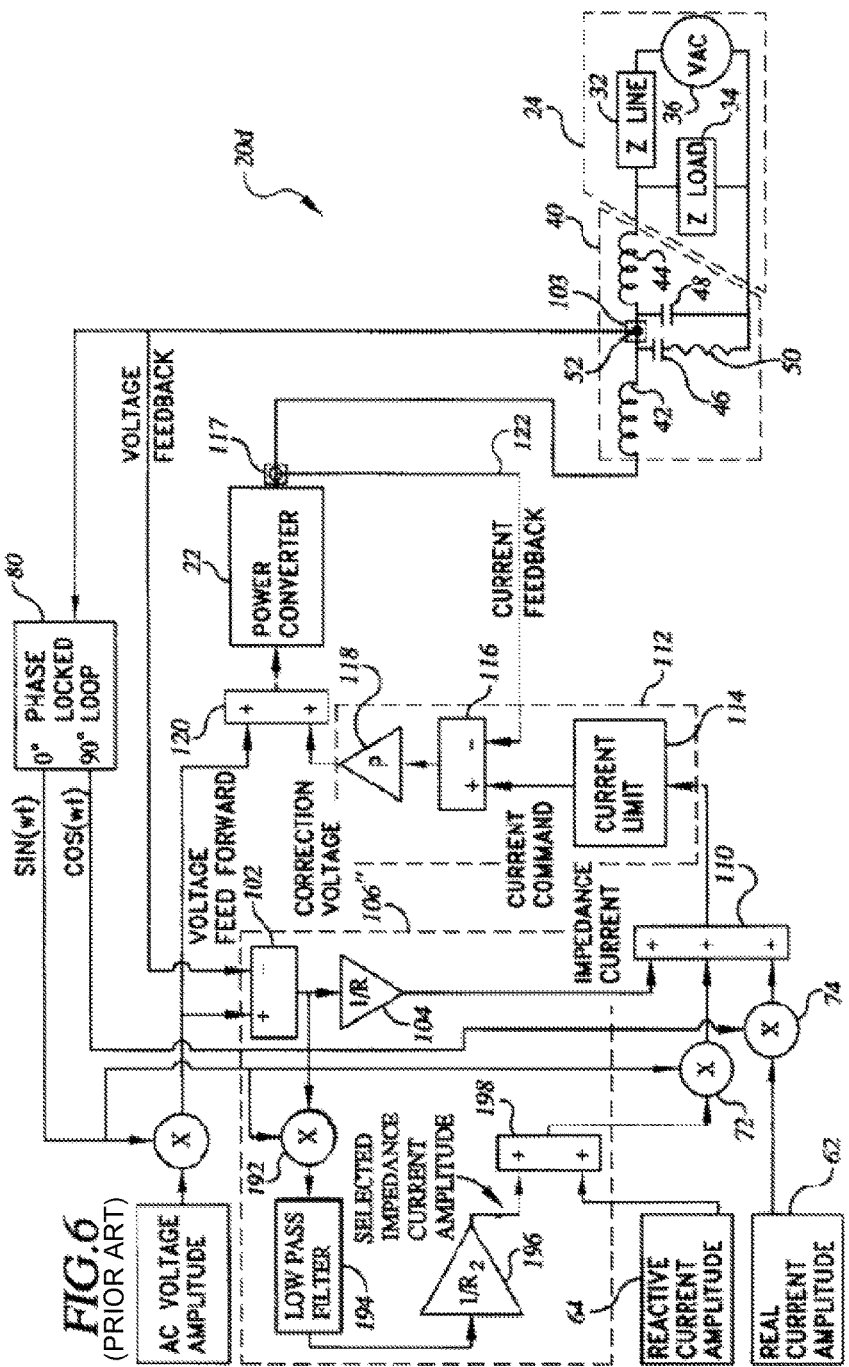
FIG. 6 is a schematic diagram of a prior-art control system that is similar to the one shown in FIG. 1, except that it includes a fundamental impedance current correction.

In some instances it may be desirable for impedance current regulator 106 to provide a low impedance (higher corrective current) for only selected frequencies, e.g., the fundamental frequency (50 or 60 Hz). Referring to FIGS. 1 and 6, this can be accomplished by including impedance current regulator 106" (FIG. 6) in prior-art system 20d in place of impedance current regulator 106 (FIG. 1) in system 20. Impedance current regulator 106", like impedance current regulator 106, includes difference unit 102 and 1/R gain 104. In addition, impedance current regulator 106" includes a multiplier 192 connected to receive as inputs the sine waveform from PLL 80 and the voltage difference signal from difference unit 102. Multiplier 192 multiplies the sine waveform by the voltage difference signal. Because this sine waveform is exactly in phase with the output voltage at tee point 52, multiplying the sine waveform by the voltage difference signal will result in the selected frequency, typically the fundamental frequency, going to DC.

This DC voltage difference signal, albeit with associated harmonics in some cases, is provided to low pass filter 194. This filter removes any harmonics present in the DC voltage difference signal, with the result that its output is the amplitude of the voltage difference determined by difference unit 102. This amplitude is multiplied by the gain 1/R2 at gain 196. The gain 1/R2 may be any function, with nonlinear functions that increase the value of 1/R2 with increasing input magnitude being of special interest (although the present disclosure also includes linear functions). In practice, the value for R2 may be selected such that the inverse $1/R_2$ is between 2% and 10% of the rated output voltage of power converter 22 divided by its rated output current. The output of gain 196 is a selected impedance current signal.

Impedance current regulator 106" also includes summing unit 198 that sums the reactive current command signal from source 64 with the selected impedance current signal from gain 196. The result of this summing is provided by summing unit 198 to multiplier 72.

In operation, the inclusion of impedance current regulator 106" in system 20d provides an increase in amplitude of the impedance current signal at only the selected frequency, e.g., 50 or 60 Hz. This is desirable when higher corrective current at the fundamental frequency may be desired, to regulate the fundamental voltage. An example is the prime source of power in an isolated or soft grid, which cannot change its output level quickly.

Figure 7:
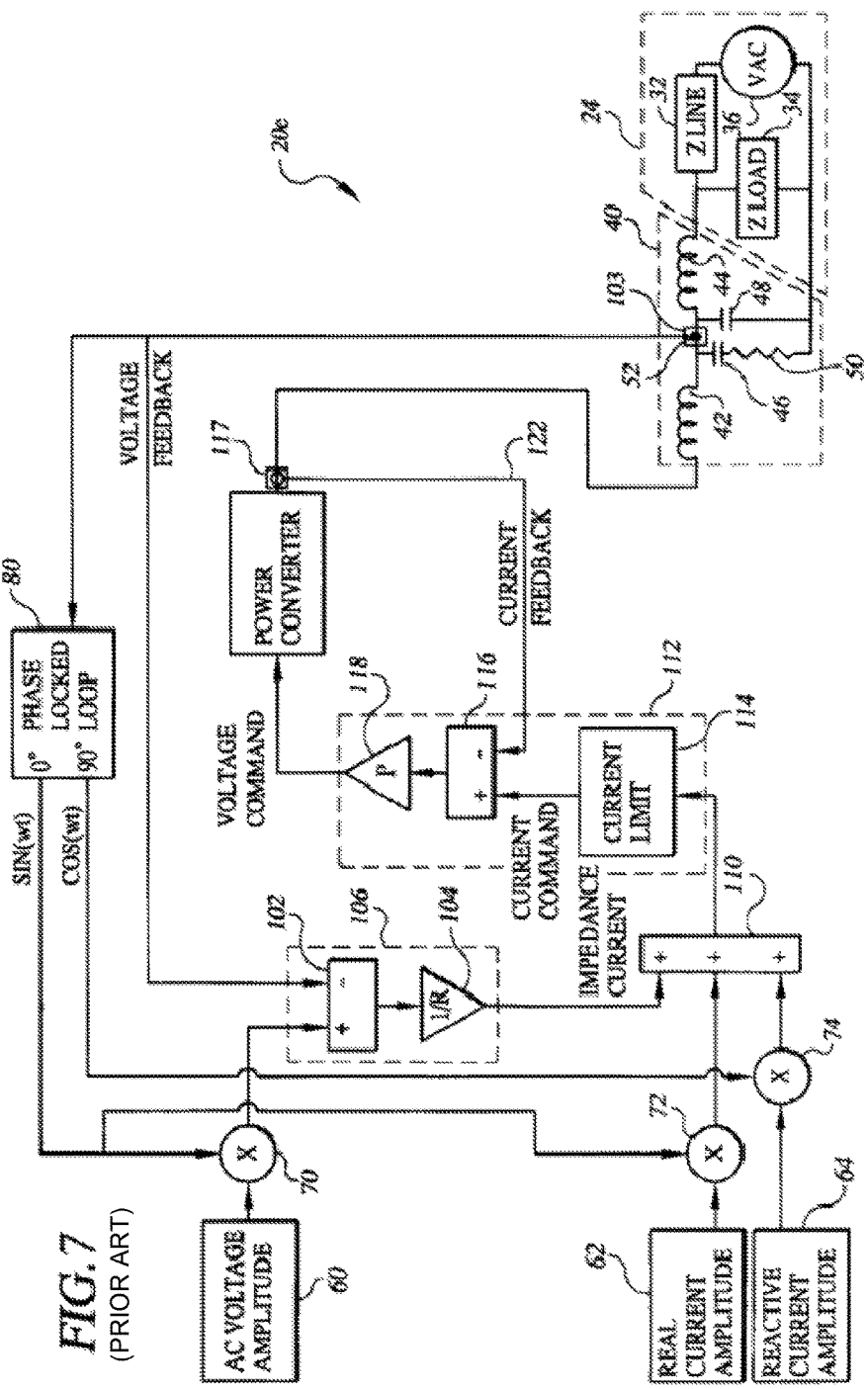
FIG. 7 is a schematic diagram of a prior-art control system similar to the one shown in FIG. 1, except that the voltage feed forward to the power converter is omitted.

Referring next to FIGS. 1 and 7, as shown in prior-art system 20e (FIG. 7), in some cases it may be desirable to eliminate the voltage feed forward signal provided to summing unit 120 (FIG. 1), which is combined with the voltage feed forward signal and provided to power converter 22. Thus, in system 20e, no voltage feed forward signal from multiplier 70 is provided, and summing unit 120 is eliminated.

The impact of not using the voltage feed forward signal on the operation of system 20e is that a higher gain P is required in the current loop. In general voltage feed forward is desired, but if the bandwidth of a system 20 is very high, then the voltage feed forward signal can be eliminated.

Figure 8:
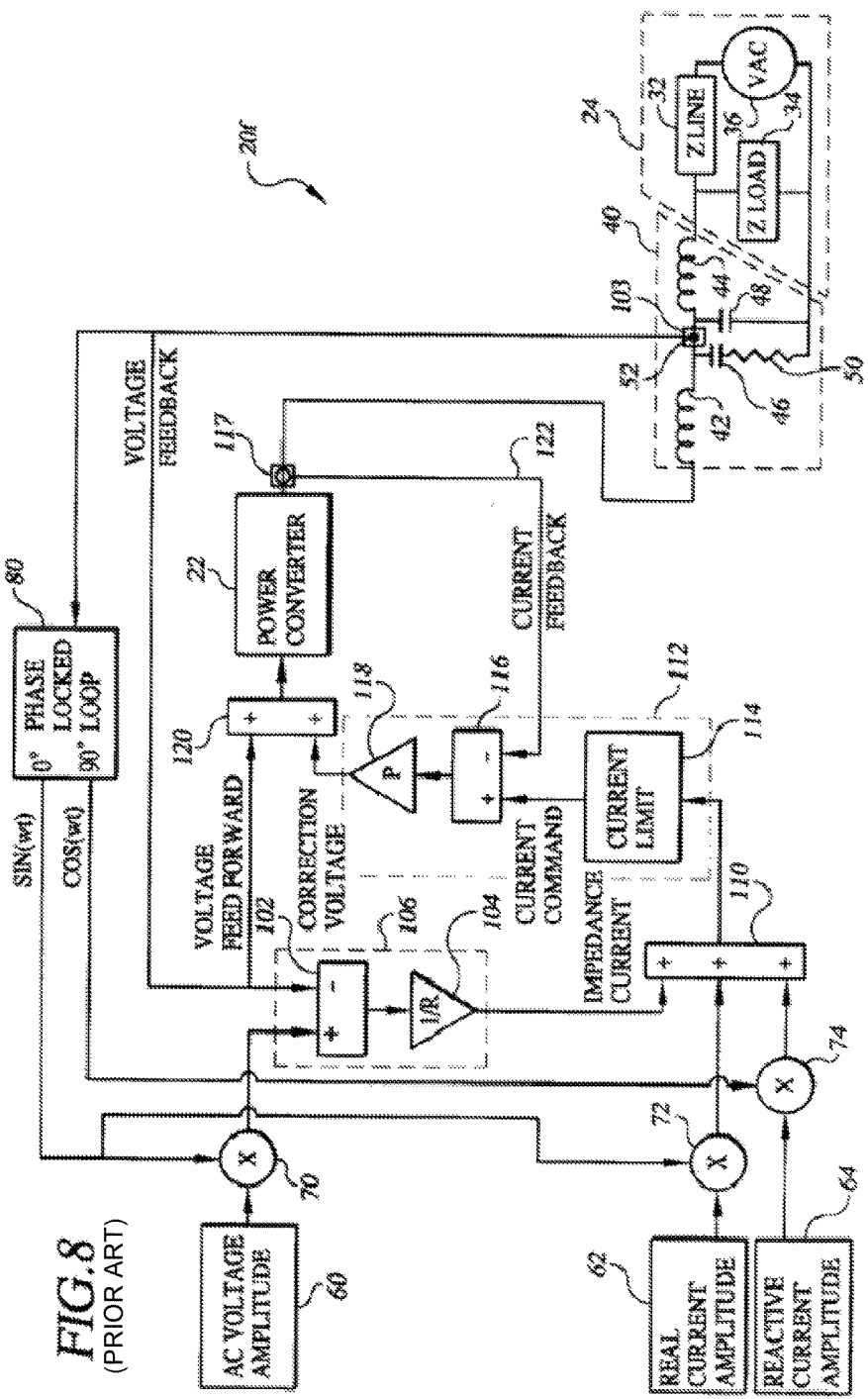
FIG. 8 is a schematic diagram of a prior-art control system similar to the one shown in FIG. 1, except that the voltage feed forward to the power converter comes from the output thereof, rather than from the reference AC voltage source.

In an alternative to system 20e, the voltage feedback signal from tee point 52 may be used as the voltage feed forward signal, as illustrated with prior-art system 20f in FIG. 8. Thus, the voltage feedback signal from tee point 52 is provided to both difference unit 102 and to summing unit 120. In operation, similar performance is achieved relative to other versions of system 20, as discussed herein.

Figure 9:
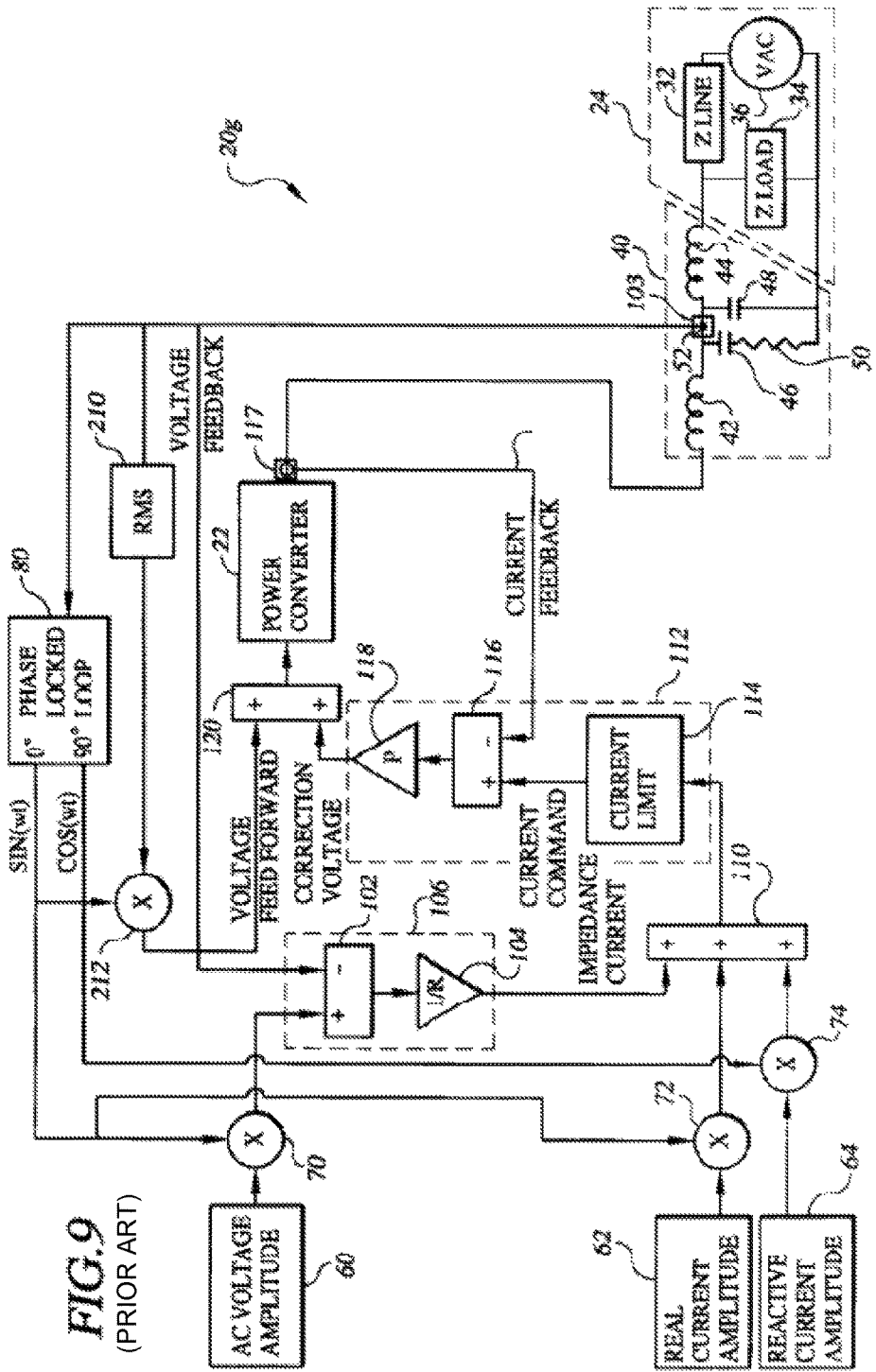
FIG. 9 is a schematic diagram of a prior-art control system similar to the one shown in FIG. 1, except that the voltage feed forward into the power converter is developed as a function of the output voltage and current thereof, rather than as a function of the output of the reference AC voltage source.
Figures 1, 10:
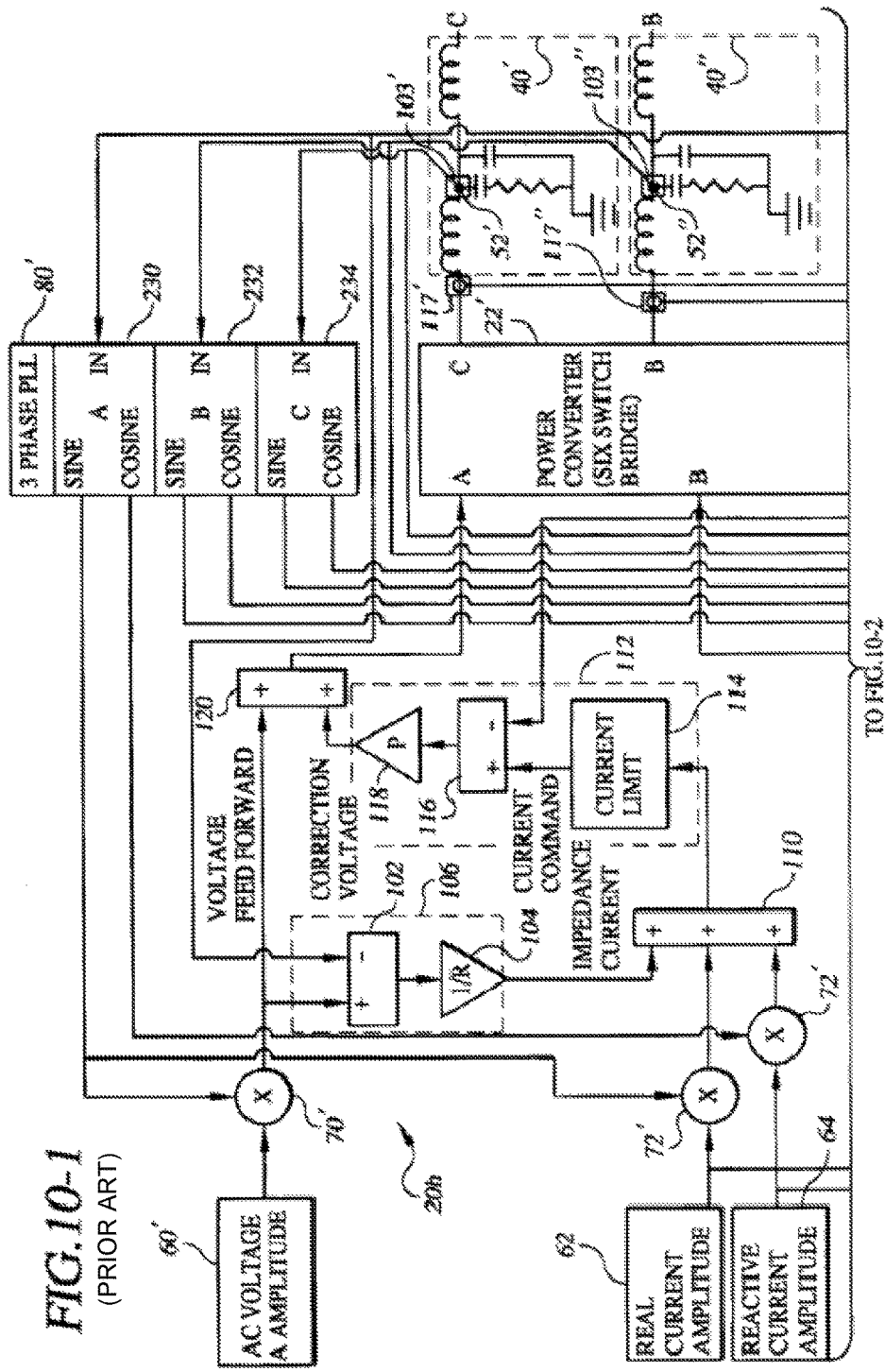
Figures 2, 10:
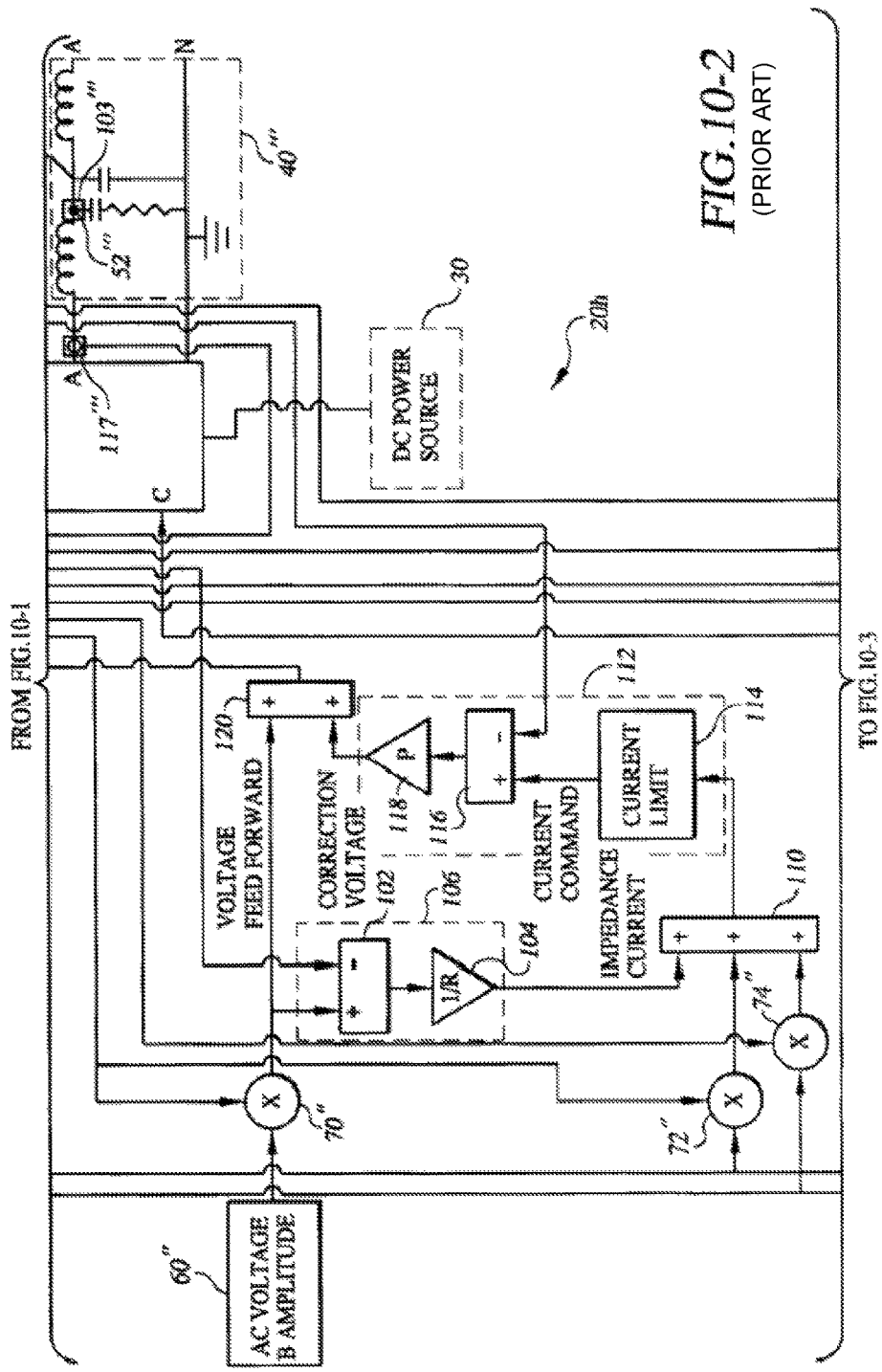
Figures 3, 10:
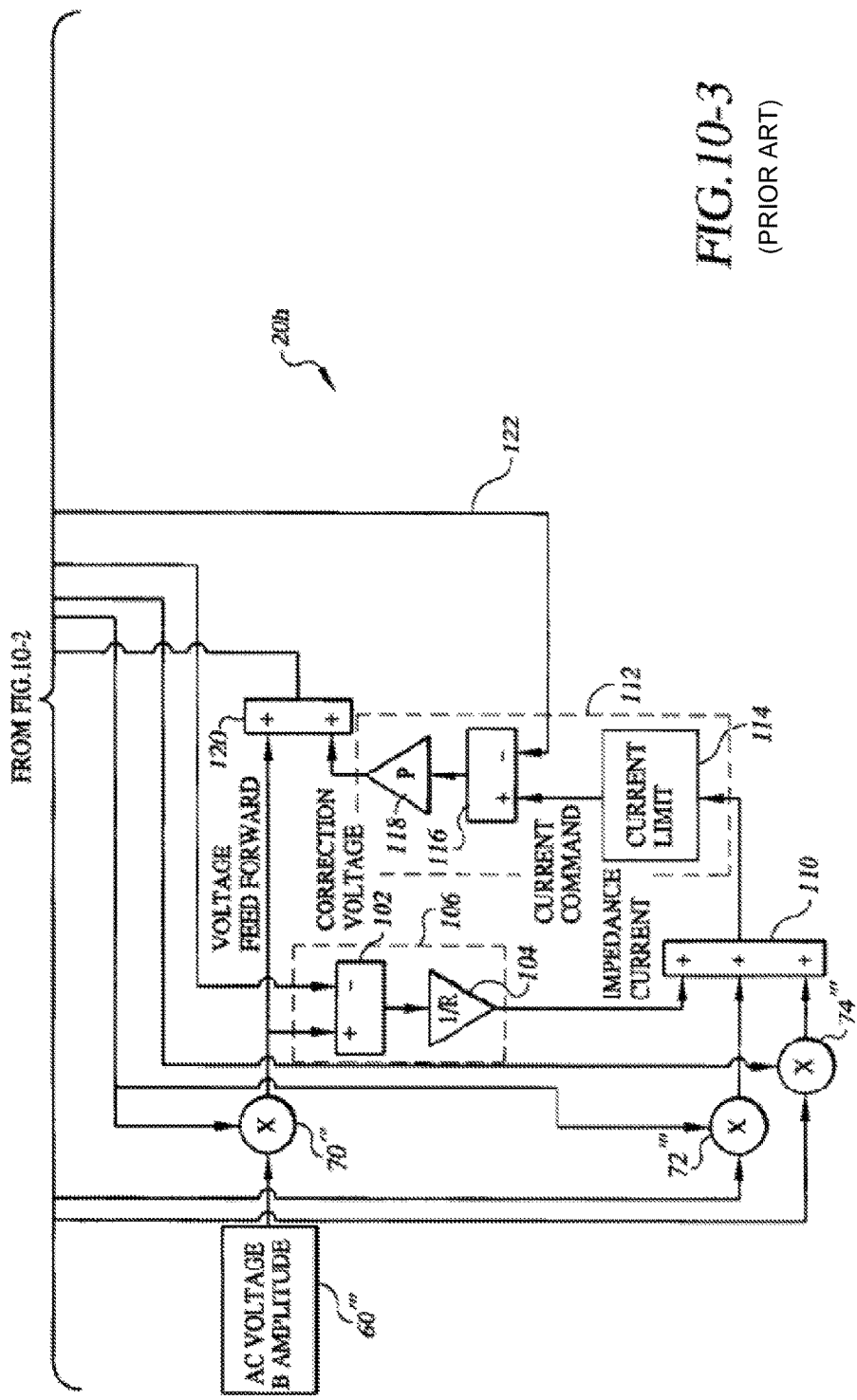
Figures 1, 11:
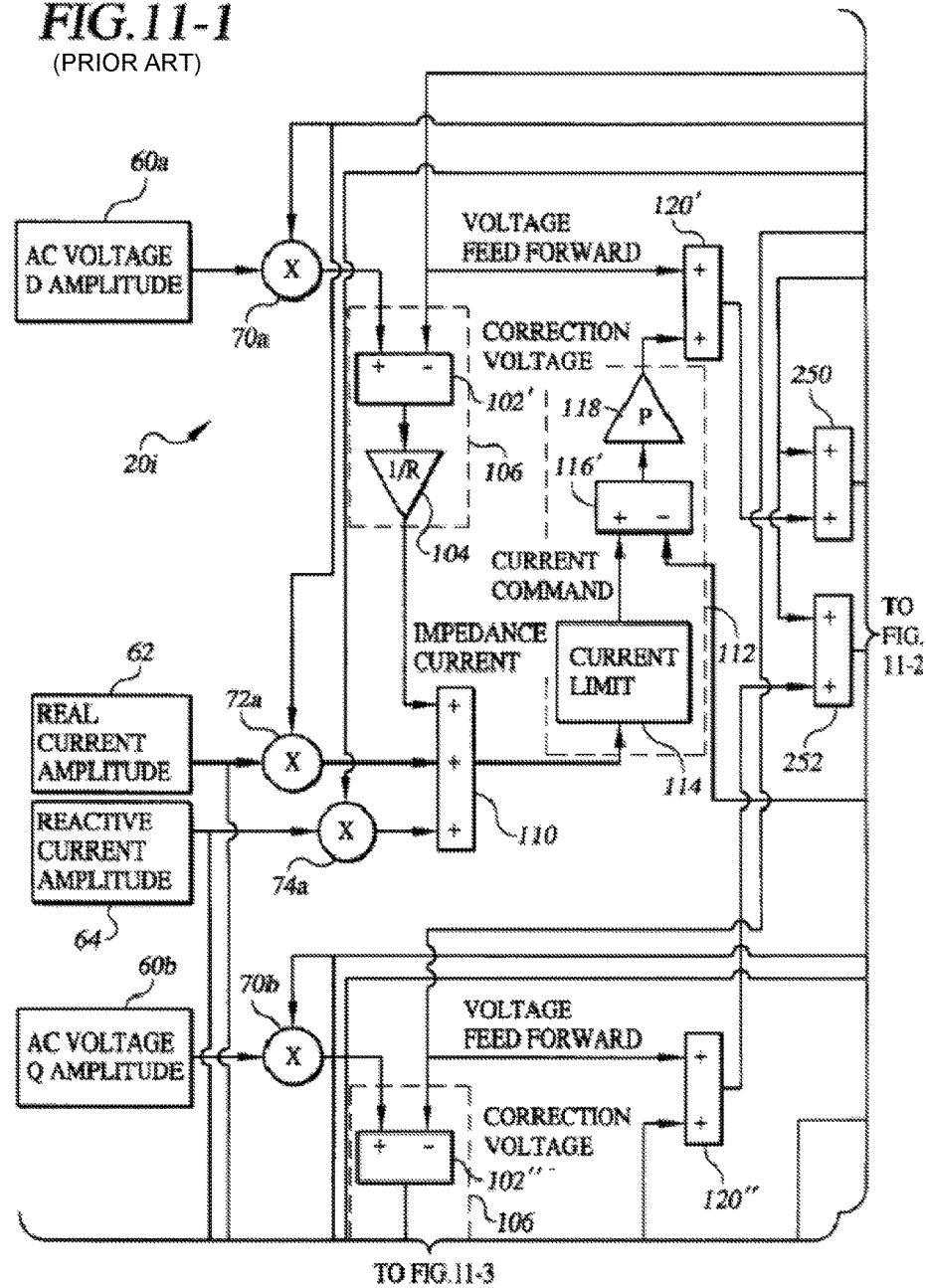
Figures 2, 11:
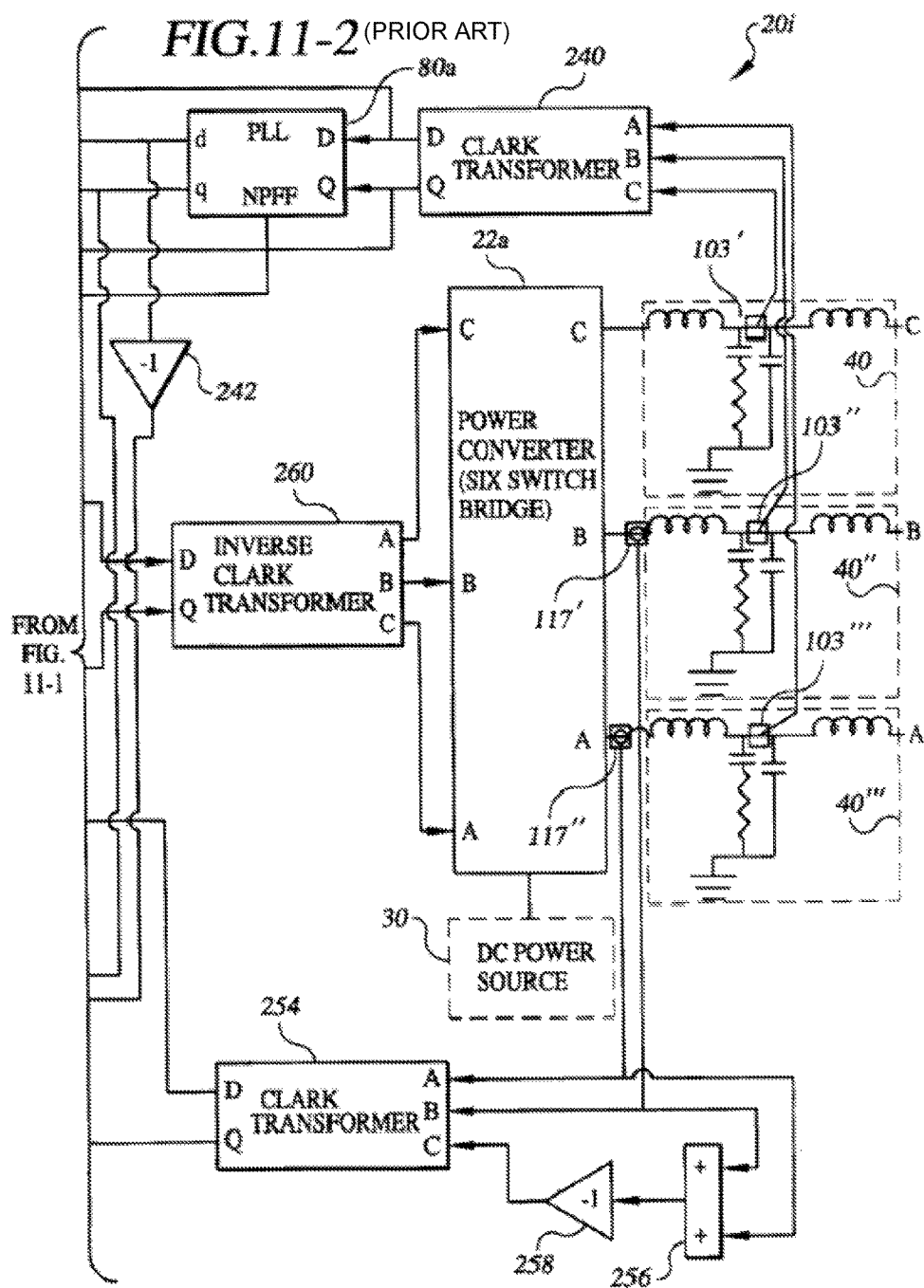
Figures 3, 11:
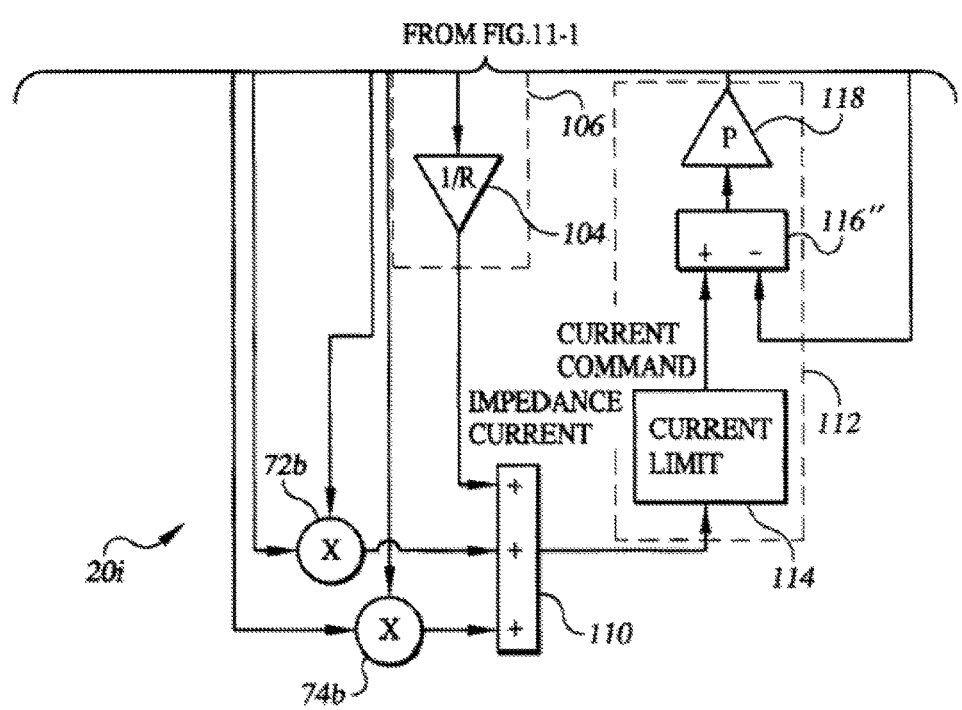

Yet another way to generate the voltage feed forward signal ultimately provided to power converter 22 is illustrated in FIG. 9 with respect to prior-art system 20g. In this embodiment, as with system 20f, the feed forward voltage is not received from multiplier 70. Instead, the voltage feedback signal from tee point 52 is provided to RMS unit 210, where the root mean square of the voltage feedback signal is determined. This RMS voltage signal is then provided to multiplier 212, where the sine waveform from PLL 80 is imposed on the RMS voltage signal. The output signal from multiplier 212 is then provided to summing unit 120 where it is combined with the correction voltage signal from gain 118 and then provided to power converter 22.

The operation of system 20g is influenced by the fact that the voltage signal provided from summing unit 120 to power converter 22 is a function of the actual amplitude of the output voltage at tee point 52, rather than the expected voltage (as is the case for system 20 shown in FIG. 1). This makes the expected voltage match the RMS value of the actual voltage so that the control system will not work too hard to try to control the RMS voltage. This version of the control system is ideal for situations when system 20g will be put in parallel with a central system that behaves as a voltage source and has a relatively large variation in RMS voltage.

Turning next to FIGS. 1 and 10-1, 10-2 and 10-3, any of systems 20, and 20a-g, described above, or other alternatives encompassed by the present disclosure, may be implemented in a three-phase, four-line environment, as illustrated in FIGS. 10-1, 10-2 and 10-3 relative to prior-art system 20h. To minimize duplication, only the voltage feedback and feed forward signal schemes from system 20 are shown in system 20h. However, the present disclosure encompasses the use of any of the control schemes of systems 20 and 20a-20g, or otherwise encompassed by the present disclosure, in system 20h. Thus, reference to system 20 (and the associated FIG. 1 in which the system is illustrated) in connection with the discussion of system 20h, as well as in the discussion of other prior-art embodiments of the disclosure illustrated in FIGS. 11-1, 11-2, 11-3 and 12-16 of system 20 is intended to cover the specific system 20 shown in FIG. 1, systems 20a-20g, and all other variations of these systems encompassed by the present disclosure. Thus, reference in the following description to system 20, and FIG. 1 in which the system is illustrated, is merely a convenient way to identify all variations of the control system of the present disclosure, is not intended to limit the disclosure to just the particular system illustrated in FIG. 1. In FIGS. 1 and 10-1, 10-2 and 10-3, like elements are referred to with like reference numbers, except that the prime notation is used in some instances in FIGS. 10-1, 10-2 and 10-3 to distinguish multiple instances of the same element.

System 20*h* comprises three single-phase systems, one for controlling each of the three phases. System 20*h* includes power converter 22', which is similar to power converter 22 except that it is designed to provide AC output power for each phase at output nodes A, B and C, and it also includes an output node N to ground. Power converter 22' includes input nodes A, B and C for receiving input control signals. A power converter having a six-switch bridge may be satisfactorily used as power converter 22', although a wide range of power converters and inverters may be used as power converter 22', as described above relative to power converter 22. Three filters 40', 40" and 40''' are provided to receive the AC power output from, respectively, nodes A, B and C or power converter 22'.

System 20*h* also includes a source 62 for a real current command signal and a source 64 for a reactive current command signal. The real current command signal from source 62 is provided to multipliers 72', 72" and 72''', and the reactive current command signal is provided from source 64 to multipliers 74', 74" and 74'''. Although common AC real and reactive current sources are used for all three phases, separate sources may be used if so desired. Three sources 60', 60" and 60''' are included in system 20*h* for providing a reference AC voltage. The voltage signal from source 60' has an amplitude A, the voltage signal from source 60" has an amplitude B and the voltage signal from source 60''' has an amplitude C. Typically, amplitudes A, B and C are all the same, although in general cases some or all of the amplitudes may be different. System 20*h* includes a three-phase PLL 80' having sections 230, 232 and 234, each for generating a sine waveform signal and cosine waveform signal having a phase that differs from the phase of the other sections.

As described above relative to PLL 80, the present disclosure encompasses a wide variety of PLLs of the type known to those skilled in the art. Section 230 receives as its input a signal from tee point 52' in filter 40', section 232 receives as its input a signal from tee point 52" in filter 40" and section 234 receives as its input a signal from tee point 52''' in filter 40'''. The sine waveform signal from section 230 is provided to multiplier 70' and multiplier 72', and the cosine waveform signal from section 230 is provided to multiplier 74'. Similarly, the sine waveform signal from section 232 is provided to multiplier 70" and multiplier 72", and the cosine waveform signal from section 232 is provided to multiplier 74". Also, sine waveform signal from section 234 is provided to multiplier 70''' and multiplier 72''', and the cosine waveform signal from section 234 is provided to multiplier 74'''. The PLLs in each of sections 230, 232 and 234 are synchronized to help simplify on/off control, although this is not a required aspect of the present disclosure.

Each phase section of system 20*h* functions like system 20, as described above. Thus, for example, the phase section receiving input signals from multipliers 70', 72' and 74' uses these signals to ultimately provide a control voltage input signal from summing unit 120 to input node A of power converter 22'. Similar control voltage input signals are provided from the summing units 120 for the two other phases to input nodes B and C of power converter 22'. The latter then converts DC power provided from DC power source into AC power in accordance with the control voltage input signals received at its input nodes A, B and C, and provides three-phase output voltage, through filters 40', 40" and 40''', to an AC power network (not shown). In addition to the above four-wire control, those skilled in the art of motor drive and converter control will appreciate there are other configurations based on a three-wire controller with neutral controller that can be used for four-wire control by rearranging the controller in a similar way to that shown below.

The power converter control system of the present disclosure may also be applied to a three-phase, three-wire power system, as illustrated in FIGS. 11-1, 11-2 and 11-3 relative to prior-art system 20*i*. Instead of including three current control loops, as in system 20*h*, system 20*i* only includes two current control loops because only two currents are to be controlled. Thus, power controller 22*a* is similar to power controller 22' (FIGS. 10-1 and 10-2), except that it includes only output nodes A, B and C, and not node N. The first current control loop includes as its inputs a reference voltage signal from multiplier 70*a*, a real current command signal from multiplier 72*a* and a reactive current command signal from multiplier 74*a*. The second current control loop includes as its inputs a reference voltage signal from multiplier 70*b*, a real current command signal from multiplier 72*b* and a reactive current command signal from multiplier 74*b*.

System 20*i* further differs from system 20*h* in that the voltage feedback signals from tee points 52', 52" and 52''' are provided to a Clark transformer 240. This transformer converts the three-phase input signals from power converter 22*a* into a direct (D) voltage feedback signal and quadrature (Q) voltage feedback signal, which are provided to PLL 80*a*. This PLL generates a direct (d) output sine waveform in phase with the direct (D) voltage feedback signal and a quadrature (q) output sine waveform in phase with the quadrature (Q) voltage feedback signal. The direct (d) output sine waveform is provided directly to multipliers 70*a* and 72*a*, and the quadrature (q) output sine waveform is provided directly to multipliers 74*a*, 70*b* and 72*b*. The direct (d) output sine waveform from PLL 80*a* is also provided to inverse gain 242, which changes the sign of the sine waveform (shifts the phase 180 degrees) and then provides the resultant sine waveform to multiplier 74*b*.

PLL 80*a* also generates a neutral point feed forward signal (NPFF) used in controlling the difference between the DC and the AC neutral that is sometimes required for a three-wire power converter to operate at minimum DC input voltage. This NPFF signal is typically a third harmonic signal which represents approximately 14% of the full-scale voltage of power converter 22. The NPFF signal is provided by power converter 22*a* via NPFF node to summing units 250 and 252. Summing unit 250 sums this NPFF signal with the voltage signal from summing unit 120' in the upper current control loop in system 20*i* and summing unit 252 sums the NPFF signal with the voltage output signal from summing unit 120" in the lower current control loop in system 20*i*. Before being provided to PLL 80*a*, the direct (D) feedback signal is also provided directly to difference unit 102' in the upper current control loop and the quadrature (Q) voltage feedback signal is also provided directly to difference unit 102" in the lower current control loop.

System 20*i* also includes a Clark transformer 254 connected to receive at input nodes A and B, respectively, current feedback signals from output nodes B and C of power converter 22*a*. Input C of Clark transformer 254 receives the summed inverse of current feedback signals from output nodes B and C of power converter 22*a*. This is achieved by providing these current feedback signals to summing unit 256 and then providing the summed current signal to inverse gain 258. The inverse current signal output from inverse gain 258 is then provided to input node C of Clark transformer 254. Like Clark transformer 240, Clark transformer 254 converts its three current signal inputs to two current signal outputs, a direct (D) current feedback signal and a quadrature (Q) current feedback signal. The direct (D) current feedback signal is provided to difference unit 116' in the upper current control loop of system 20*i* in FIG. 11-1 and the quadrature (Q) current feedback signal is provided to difference unit 116" in the lower current control loop of system 20*i* in FIG. 11-2.

Because power converter 22*a* requires three input control signals, one for each phase, an inverse Clark transformer 260 is provided. The voltage control signals from summing units 120' and 120" are each combined with the NPFF signal from PLL 80*a*, and then are provided to input nodes D and Q of inverse Clark transformer 260. The latter then generates output control signals on nodes A, B and C that are provided to power converter 22*a*. Based on these control signals, power converter 22*a* converts DC power from DC power source 30 into AC power provided via output nodes A, B and C, respectively, to filters 40', 40" and 40''' and then on to the AC power network (not shown).

System 20*i* functions similarly to system 20*h* in that separate control sections are used. However, inclusion of only two control sections and use of the Clark transformers 240 and 254, and the inverse Clark transformer 260, permits use of system 20*i* in a three-phase, three-wire power system, because there are really only two unique current to control given that $i_a+i_b+i_c=0$.

Figure 12:
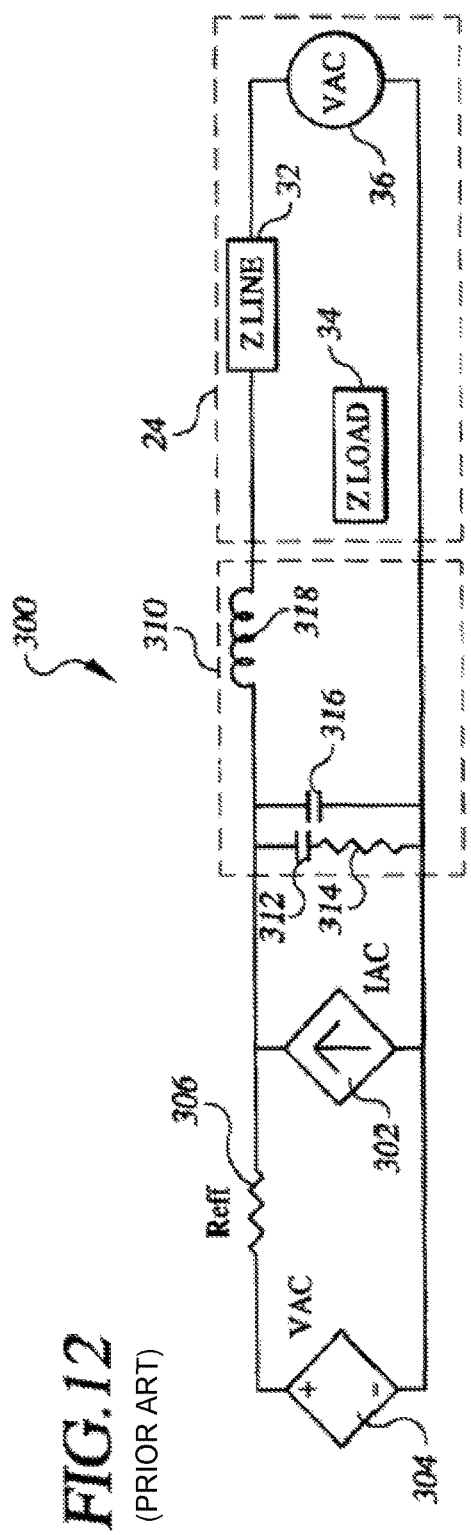
FIG. 12 illustrates an effective model of a prior-art control system.

Turning next to FIGS. 1 and 12, a control system of the present disclosure may be represented by model 300. The current command signal provided from sum of the signals from multipliers 72 and 74 can be considered to control a dependent current source (IAC) 302, and the voltage command signal provided from output of multiplier 70 can be considered to control a dependent voltage source (VAC) 304. These sources are connected in parallel to one another and to AC power network 24, and must be considered synchronized to the output voltage. An effective resistance ($R_{eff}$) 306 is connected between VAC source 304 and IAC source 302. $R_{eff}$ 306 represents the impedance control provided by the control system of the present disclosure. The value of $R_{eff}$ is the same as the R in gain 104 in impedance current regulator 106, as described above. Note, $R_{eff}$ is not a real resistor and has no power loss; it simply represents a resistance that power converter 22 mimics.

Model 300 includes filter 310 that has a capacitor 312 connected in series with resistor 314. This capacitor/resistor combination is connected in parallel to IAC 302 and VAC 304. A second capacitor 316 is provided in filter 302 and is connected in parallel with capacitor 312 and resistor 314. Filter 310 further includes an inductor 318 between capacitor 316 and AC power network 24. Filter 302 does not include a first inductor, like inductor 44 in filter 40 (FIG. 1), because it has no effect on the performance of this effective model due to its inclusion inside the current control loop.

Model 300 can be used to understand how the control system of the present disclosure behaves. If the current command signals from sources 62 and 64 are zero and the voltage command signal from source 60 equals the output voltage of power converter at tee point 52, there will be no current coming out of the power converter. If there is a disturbance of the output voltage, current will flow from VAC 304 to AC power network 24 to help restore the voltage to its original value. This disturbance could be a rise or drop in voltage, a harmonic voltage or a switching transient, or anything else that makes the voltage deviate from a pure sine wave at the desired voltage.

Consider the case where the voltages from tee point 52 and multiplier 70 are matched as before and a current command is added. If AC power network 24 is a stiff low impedance network, where power converter 22 is a small part of the network power, the current command will go to the AC power network with little change in the voltage at tee point 52. Thus, the impedance current regular 106 will not modify the current command signal provided at the output of summing unit 110 by much. However, if power converter 22 is a significant factor in AC power network 24, where the voltage would change significantly if that current where imposed on the network, then the impedance current control loop including regulator 106 will pull a large percentage of the current back and thus keep the power network voltage in tolerance.

Figure 13:
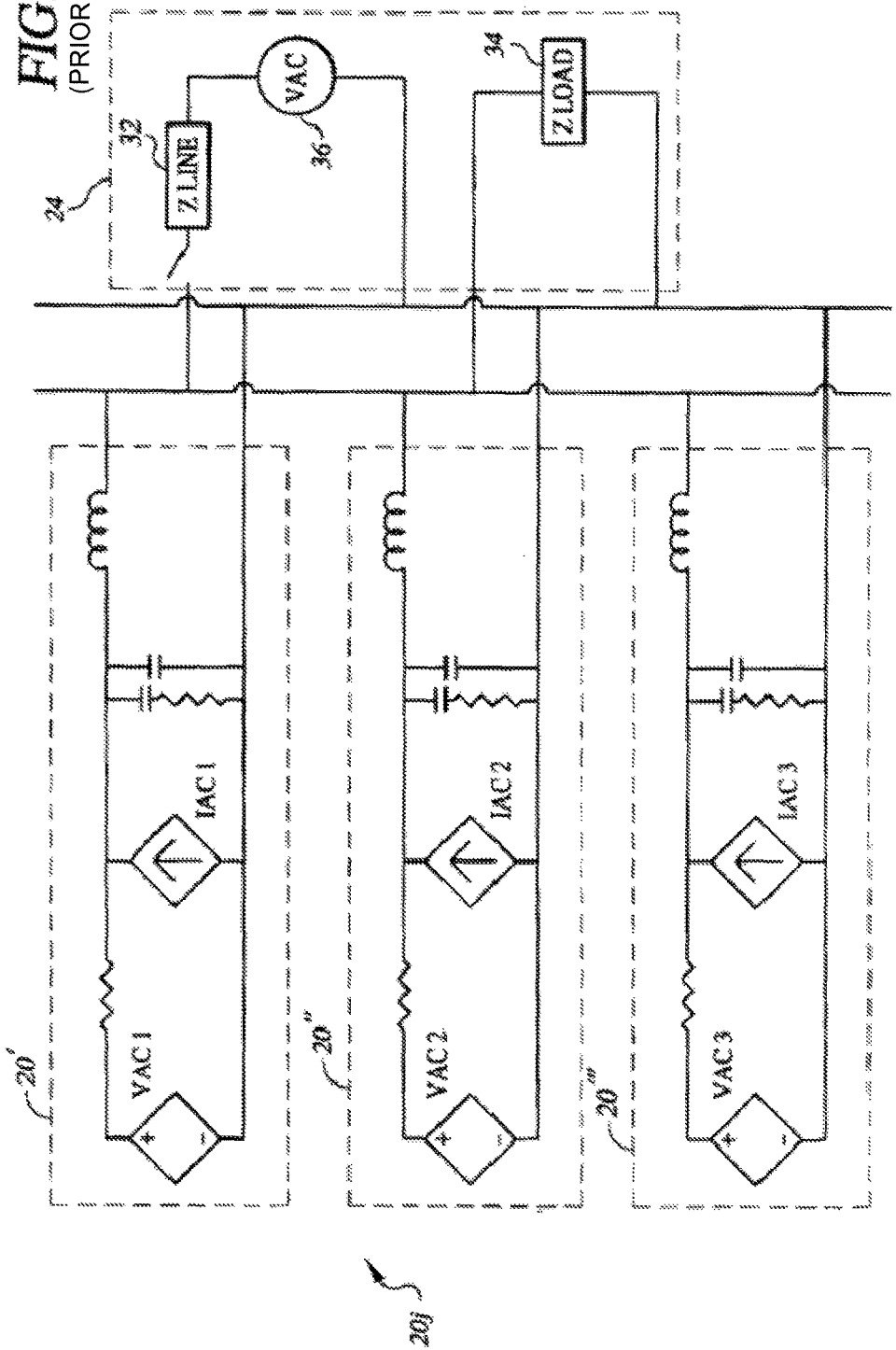
FIG. 13 is a schematic diagram showing three control systems of the type illustrated in FIG. 1 connected in parallel to a single load.

While system 20, and its variations discussed above and otherwise included in the present disclosure, may be used individually, desirable results are achieved when multiple ones of system 20 are connected in parallel with single or plural loads. Referring next to FIGS. 1, 12 and 13, and using model 300 as shorthand way to depict a system 20, plural ones of such system, identified as systems 20', 20", 20''', may be connected in parallel with AC power network 24, as shown relative to prior-art system 20*j* (FIG. 13). While three systems 20 are illustrated in parallel connection in FIG. 13, it is to be appreciated that two or more than three, substantially more than three in some applications, may be used in parallel configuration.

Figure 14:
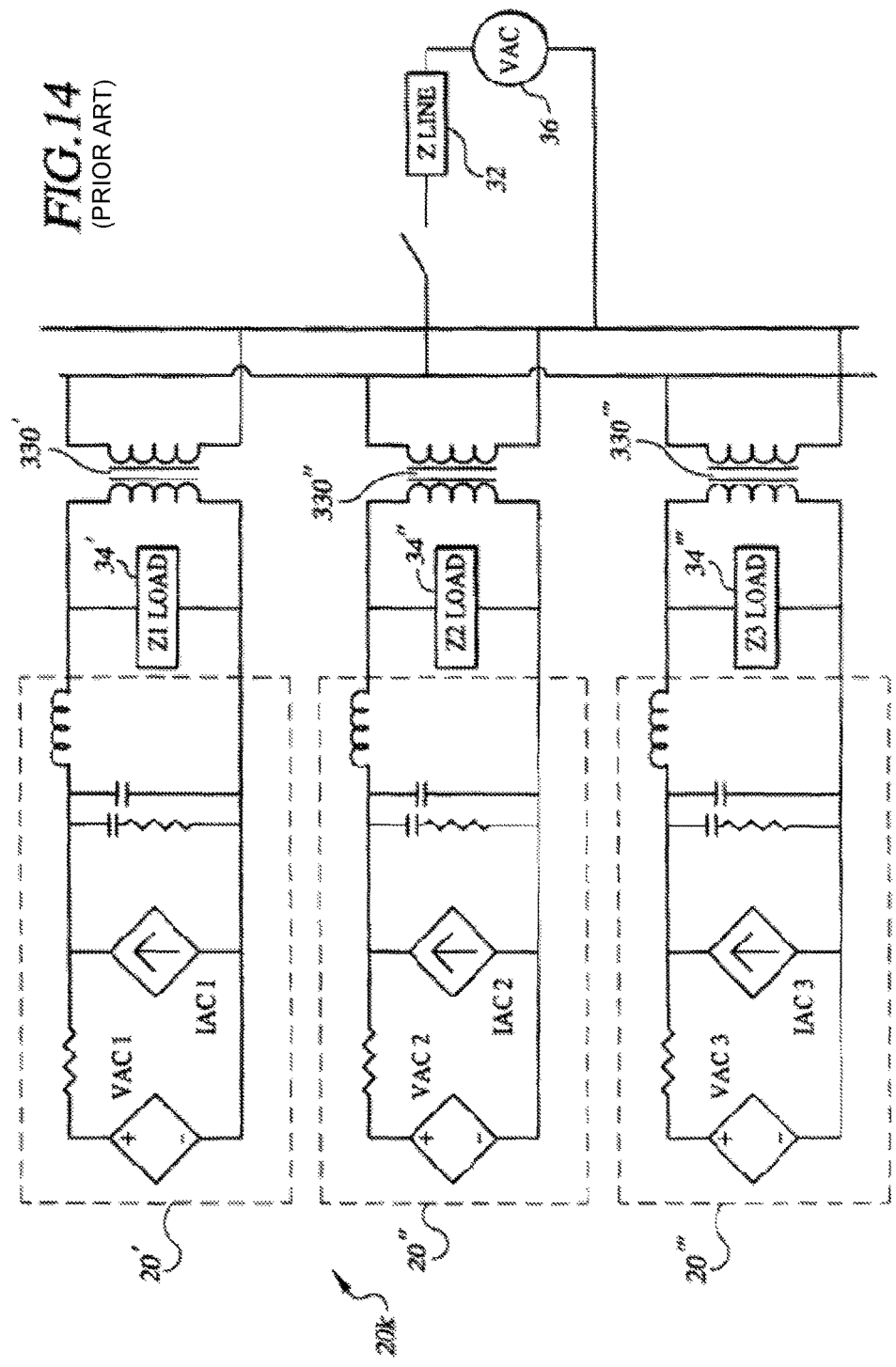
FIG. 14 is a schematic diagram of prior-art control systems similar to the one shown in FIG. 13, except that each control system is connected to a respective load rather than all of the control systems being connected to a single load.

Turning next to FIGS. 1 and 12-14, instead of supporting a single load 34, systems 20', 20", 20''' may be each connected, respectively, to a separate load impedances 34', 34", 34''', as illustrated in FIG. 14 relative to prior-art system 20*k*. In system 20*k*, transformers 330', 330", and 330''' are connected, respectively, in parallel with load impedances 34', 34" and 34''' between the load impedance and the single line impedance 32 and EMF 36. Transformers 330', 330" and 330''' are not needed if systems 20 are close together. Again, while three systems 20 are illustrated in parallel connection in FIG. 14, it is to be appreciated that two or more than three, substantially more than three in some applications, may be used in parallel configuration.

Various benefits are achieved by paralleled system 20*k* and 20*j*. If there is a surge in current, systems 20', 20", 20''' all work together to address this situation since the behavior of each system is influenced in part by power attributes of AC power network 24 (based on the information in signals from tee point 52).

By paralleling the systems 20', 20", 20''', a large amount of current may be supplied by the associated DC power converters 22 so as to clear a current fault. In the case of a surge, voltage is supported and equipment connected to AC power network 24 is protected from an over-current situation. This occurs because each of systems 20', 20" and 20''' work together to optimally provide and/or absorb voltage and current with their associate DC power supplies 30 until the surge is over. System 20*j* provides a high reliability power system that is made of a large number of small systems working together.

The present disclosure also permits that use of a number of smaller and less expensive power converters 22 that together cost less than a single power converter suitable for the entire load requirements of AC power network 24. For a larger network (e.g., five or more systems 20) the peak power rating of each individual power converter 22 can be lower than if each unit had to supply its own peak power. For example, a residential specification for a standalone fuel cell, might require 7 kW average power and a peak rating of 20 kW. With system 20k, a connection of ten systems 20 on AC power network 24 could provide a power rating of 7 kW continuous and 10 kW peak. In this case, two or more loads could still peak at a time depending on the total system load. Consider another way, the total system 20k could run a load with a power rating of 70 kW continuous with a peak of 100 kW, with the system incorporating relatively small and inexpensive power converters 22.

Considering further the operation of system 20k, the DC power sources 30 associated with each power converter 22 may be used to support a number of loads in a widely dispersed power distribution system. This network could be a three-phase industrial network or a single-phase residential network. In this type of application, the systems 20', 20", and 20'" all share the base load, represented by load impedances 34', 34" and 34''', the line load, represented by line impedance 32, EMF 36, and the associated peaks, the transients and the harmonics.

Systems 20j and 20k, in a typical implementation, enjoy important redundancy. Assume each of systems 20', 20", and 20'" is supported by a bi-directional energy source, such as a fuel cell with a battery for transients. (There could be any number of systems 20 here—in fact the more there are the better the system performs.) Assume also the total capacity of any three energy sources can support the load. Here there are four sources, three DC power sources 30 and AC power network 24. Systems 20j and 20k have built-in redundancy due the fact that only three sources are required to keep it running. To simplify understanding of this redundancy, assume systems 20', 20", and 20'" are of all equal size (although they can be of any size).

Figure 15:
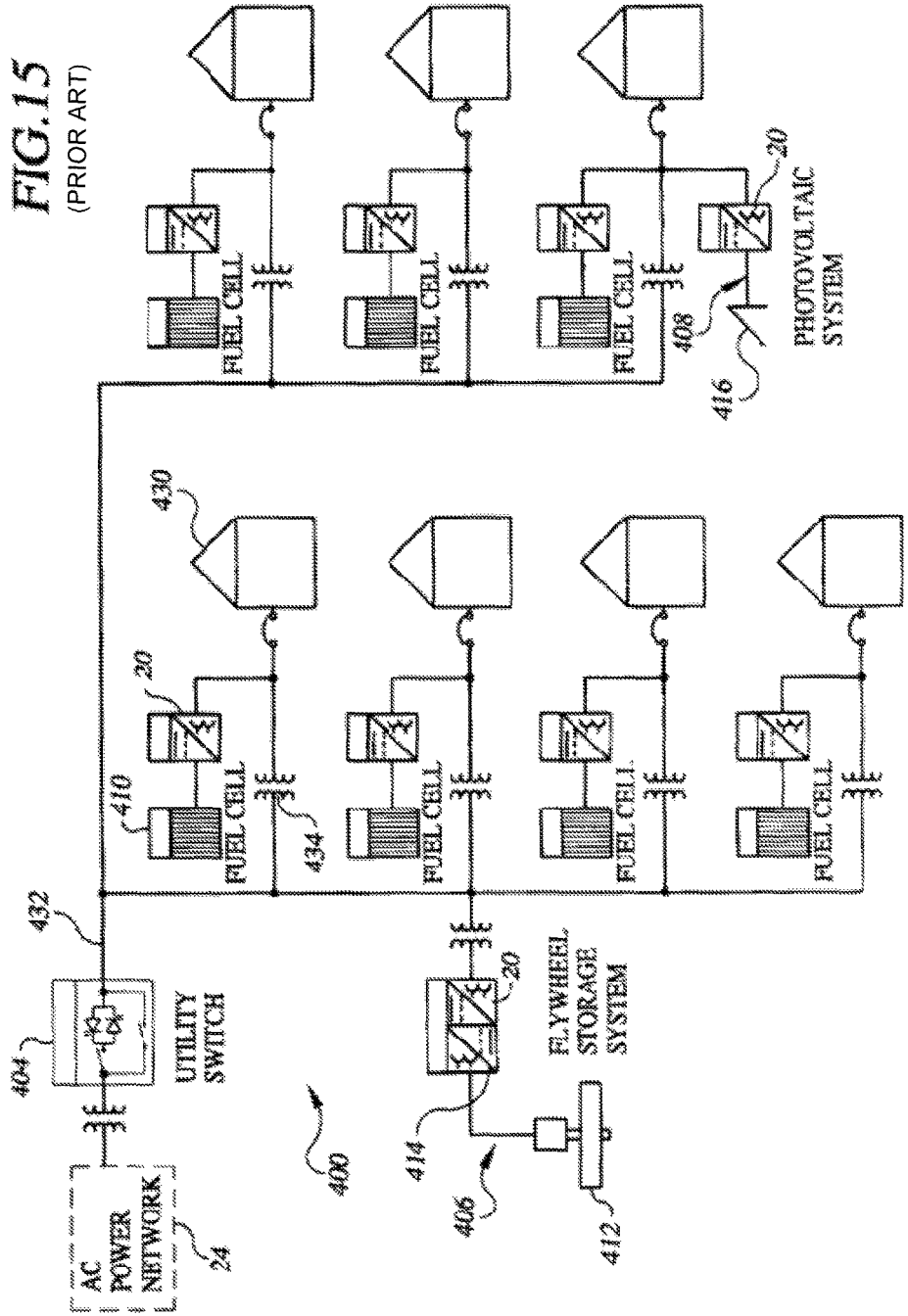
FIG. 15 is a schematic diagram of a prior-art distributed generation power network including multiple installations of a control system of the present disclosure.

Referring now to FIGS. 1 and 15, system 20 may be beneficially used in a distributed generation (DG) power network 400. The prior-art DG network 400 shown in FIG. 15 is a residential network. However, it is to be appreciated that DG networks 400 with which system 20 may be used include any combination of residential, commercial and industrial power consuming entities (and power providing entities as well, in some cases).

DG network 400 is connectable with an AC power network 24, e.g., a utility power grid. A utility switch 404 may be provided to selectively connect and disconnect DG network 400 from AC power network 24, but the switch is not mandatory. DG network 400 includes, for example, one or more DC power sources such as flywheel storage system 406, photovoltaic system 408 and fuel cells 410. Flywheel storage system 406 includes a flywheel 412, an active rectifier 414 and a system 20. Photovoltaic system 408 includes a photovoltaic array 416 and a system 20. Each residence includes a fuel cell 410 and an associated system 20.

In the exemplary DG network 400, photovoltaic array 406, fuel cells 410, flywheel 412, and battery 414 all constitute DC power sources 30, as described above in connection with the description of system 20. Although not shown, DG network 400 may include DC power sources 30 that generate power from any fuel. Indeed, DG network 400 may include any source of power. Further, AC power network 24 is not limited to a utility grid; any source of AC power may be provided by network 24.

Each residence 430 is connected directly to AC power network 24 via distribution line 432, with transformers 434 appropriately interposed. Flywheel storage system 412, via system 20, is also connected to distribution line 432, as is photovoltaic system 408 via its system 20. The fuel cell 410 associated with each residence 430 is also connected to the residence via its associated system 20.

In operation, DG network 400 allows the collection of residences 430 to operate as an independent power network. Such independent operation may be desirable, for example, when power can be provided by sources within the independent power network, e.g., fuel cells 410, less expensively than from AC power network 24. Also, if power quality from AC power network 24 does not meet desired standards, or the network is temporarily unable to provide power, independent operation may be desirable. Yet another advantage of using systems 20 within DG network 400 is that current faults and surges, along with transients and harmonics, from AC power network 24 can be compensated for by the systems 20, as discussed above.

A powerful attribute of systems 20 is that the control of DG network 400 can be achieved without the use of an independent control system connecting together the various DC power sources 30 in the network. Known power control systems typically require such separate control system, thereby precluding the "plug and play" operation obtained with systems 20. Thus, systems 20 make it relatively easy and inexpensive to develop a DG network 400. Also, by the use of system 20 the dispatch of energy from the DC power sources, e.g., flywheel 412, within DG network 400 is such that it tends to stabilize the short term voltage within the grid while allowing external commands to influence the relative real and reactive power supplied by each source.

Figure 16:
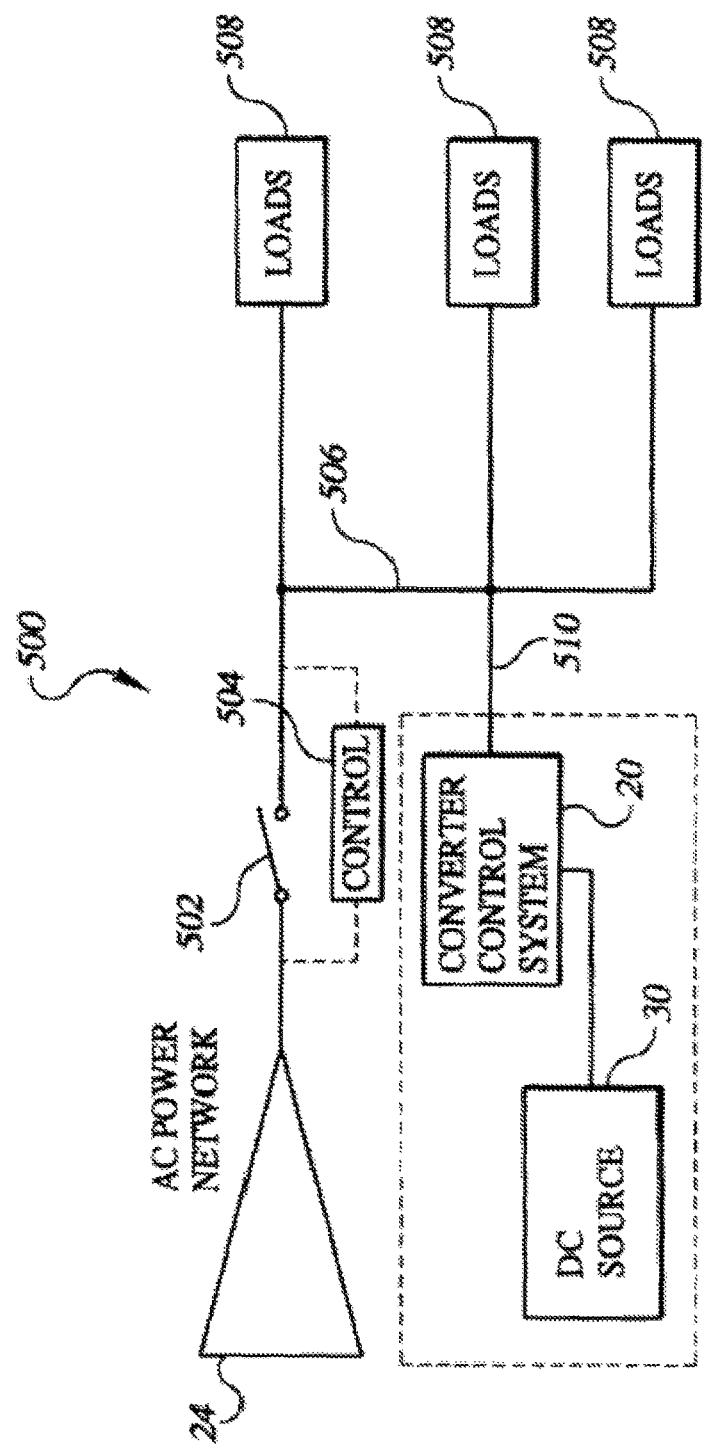
FIG. 16 is a schematic diagram of a prior-art uninterruptible power network including a power converter control system of the present disclosure.

Turning now to FIGS. 1 and 16, system 20 may be used advantageously in a prior-art uninterruptible power supply (UPS) 500. In UPS system 500, AC power network 24 is connected with switch 502, which is controlled by control 504, via distribution line 506 to a plurality of loads 508. These loads may include, for example, a residence, a factory, or a particular piece of equipment. UPS system 500 also includes one or more DC energy sources 30 connected via system 20 and distribution line 510 to loads 508. UPS system 500 is distinguishable from system 400 in that its DC energy source 30 is capable of generating and storing energy via energy sources other than fuel such as gas or coal. A flywheel or photovoltaic array are examples of suitable DC energy sources 30 for UPS system 500.

When switch 502 is closed, system 20 can address current faults and surges, along with transients and harmonics, in the manner discussed above using DC power from source 30, which the power converter 22 in system 20 converts to AC power before delivery to loads 508. When control 504 senses that the AC power from network 24 is falling out of predetermined tolerances, then it opens switch 502, and DC power source 30 can function as the sole source of power for loads 508. UPS system 500 accomplishes these functions without the need for separate control systems between control 504 and system 20, and between plural systems 20 when plural DC energy sources 30 are employed.

The basic configuration of the power systems shown in FIGS. 15 and 16 is the same with regard to switches 404 and 502. There is an AC power network 24, e.g., a utility, on one side and a source of load support on the other side of these switches. In this regard, these power systems are the same.

In fact, system 20 makes it possible to provide both DG and UPS type functions in a single system.

In the preceding description, power converter 22 has been described as connected to DC power source 30. The present disclosure also encompasses the use of AC power sources in place of DC power source 30, e.g., a microturbine.

In addition to the advantages and benefits of the control system of the present invention discussed above. Other benefits are provided by systems 20 and all variations thereof encompassed by the present disclosure, whether specifically described herein or not:

Individual power levels of each system 20 can be controlled. Selected current sources 62 and 64 can be commanded to a high level, which will export power to AC power network 24 for the system 20 connected to the current sources, or the current sources can be command to zero and the associated systems will operate in standby and support the voltage as needed. Any one DC power source 30 can be commanded to supply current to AC power network 24 while the others run in standby or possibly absorb the power into a storage unit.

The control provided by the present disclosure for transitioning DC power sources 30 from on grid to isolated operation, and vice versa, affords very good off-line uninterruptible power supply (UPS)-like operation.

Any of systems 20', 20", and 20''' (and any additional systems 20), including AC power network 24, can go off line. As an example, assume the entire system, e.g., system 20j or 20k, was operating with a stable balanced load equal to the power rating of about two power converters 22 and 1/R for each power converter is the inverse of 5% of the power converter's voltage rating divided by its current rating. Also assume each the amplitude of the current command signals for each power converter 22 is set to 25% of rating for the power converter and the AC voltage is at its nominal rated value so each power converter 22 is making about 12.5% of the load current and AC power network 24 is supplying the other 62.5% of the current. This would be the case if the AC power network output impedance is about 20% of rating of a single power converter or, in other words, is rated to supply about 5 times the power and has a 5% output impedance. If AC power network 24 then drops out (opens), systems 20', 20", and 20' will sense the voltage drop and each will supply more current. They would jump to about 33% of the total load or 67% of their rating each. This increase in current would be associated with a drop in voltage of only about 67%–12.5%*5% or 2.725%. This correction would be very fast and the system voltage would recover in less than 1 mS.

The control scheme of the present disclosure takes care of the power transients so the switching between modes will be smooth. This smooth switching includes switching between various AC power sources connected in parallel including the utility grid.

The impedance current regulation of the present disclosure is an efficient method to deal with load current harmonics. The impedance current control is performed very quickly. The actual voltage from tee point 52 is compared to an ideal voltage wave from multiplier 70 and the voltage correction signal provided by voltage correction unit 112 is modified to push the voltage closer to the ideal voltage. This gives the capability to share harmonic loads between systems 20. Because of transformer and cable impedance, the system harmonic currents cause the largest voltage perturbations at their source. This means that the largest amount of correction will come from the system 20 nearest the harmonic source. Lesser amounts of correction will come from other nearby systems 20. This solution to harmonic problems provides for lower stress on distribution equipment and higher efficiency than a centralized harmonic correction source.

A network with dispersed systems 20 will have high power quality. This occurs because harmonics disturbance on the power system is corrected near their source. As a result, less equipment is affected by the disturbance and to a lesser extent.

With the right protective equipment, a network of systems 20 can be used to make very high reliability power systems. Systems 20 provide fast transitions and, when used with conventional protection equipment, isolate the power system from faults. Redundant power sources can be connected to the power network to increase system reliability.

Power system including systems 20 will tend to be more stable than a typical utility system since each system 20 presents a resistive impedance to AC power network which will tend to stabilize transients and absorb reactive energy. Any number of power converters 22 of different sizes can be connected in parallel and share all load currents without the need for high-speed communications between converters. All load currents include real, reactive, harmonic and transient currents. Through adjustment of real current command source 62 and reference current command source 64, output currents of the power converters 22 may be balanced for system optimization and integration of various types of energy sources with various response times. In this way each power converter 22 provides what current it can to support AC power network 24, but can be commanded up or down to change its relative share of the real power. In addition, system 20 is "plug and play." In other words, each power converter 22 inherently works with the other converters without having to know which other sources are connected at any point in time.

Feedback-Based Control Systems

As mentioned above, aspects of the present disclosure include feedback-based control systems that allow power converters to continue operating within their limits and continue providing AC power to the power networks to which they are connected during various types of disturbances. For example, under substantially balanced voltage sags/swells during steady state or transient operation, it has been observed that the voltage error that drives the impedance current regulator term, for example, gain 104 of FIGS. 1, 3, and 7-11 and the gain of gain unit 148 of FIG. 4, can be significant and thus contribute to excess currents from the power converter if the amplitude of the feedforward signal, for example, the signal from reference AC voltage command signal source 60, does not match the amplitude of the voltage feedback, for example, from filter 40 (e.g., FIGS. 1 and 3, among others). To aid in diminishing the negative effects of a sudden mismatch between the amplitudes of the feedforward signal and the voltage feedback, reference AC voltage command signal source 60 may be replaced by an active feedforward loop that imparts a delay into a feedback signal based on the output of the power converter to an AC power network. An example of such an active feedforward loop is illustrated in FIG. 17, which, for simplicity is based on FIG. 3 described above in detail.

Figure 17:
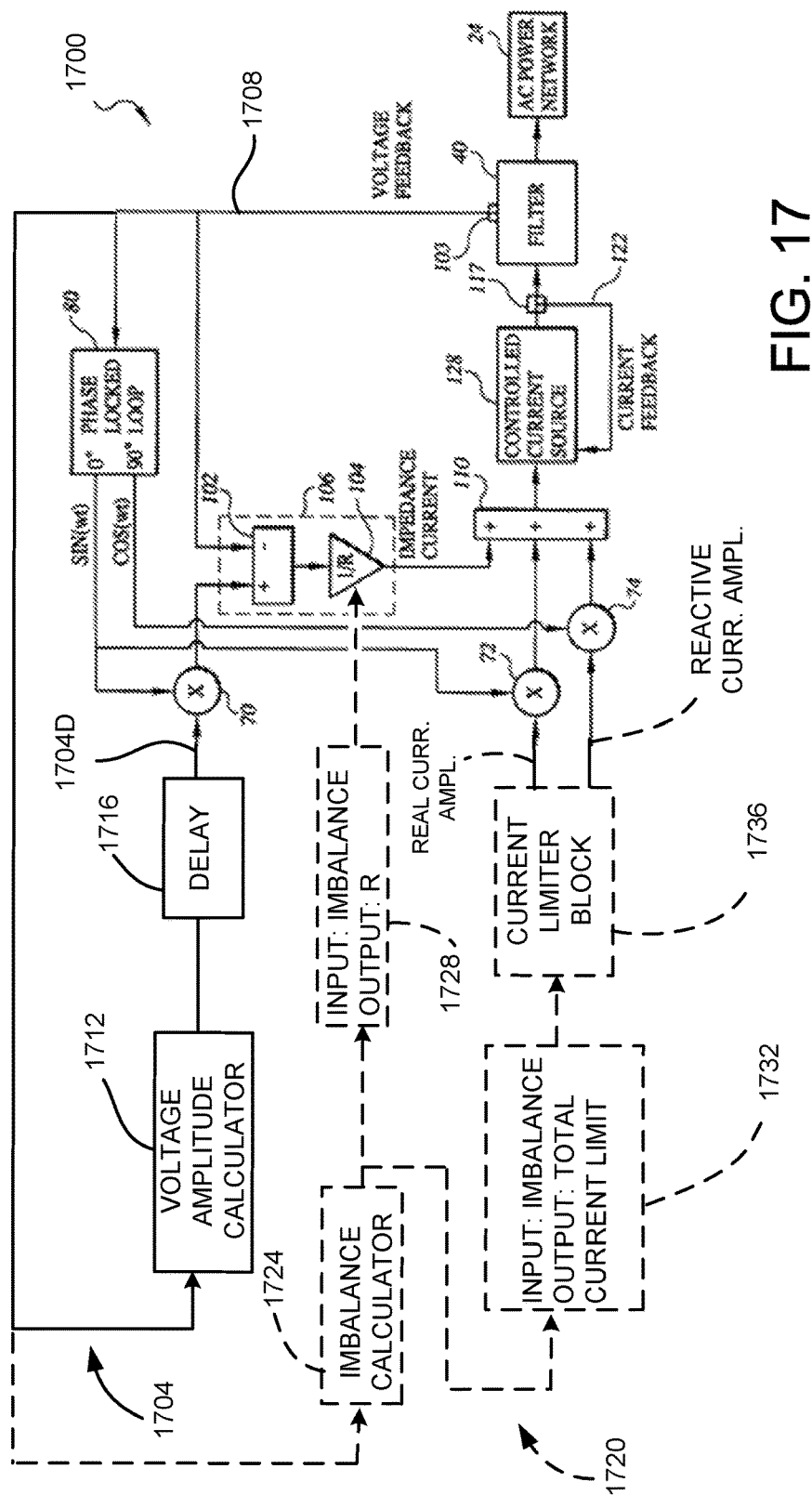
FIG. 17 is a schematic diagram of the control system illustrated in FIG. 3 modified to include feedback control for allowing the controlled current source to stay within its operating range during various transient conditions.

Referring to FIG. 17, system 1700 includes an active feedforward loop 1704 in place of reference AC voltage command signal source 60 of system 20a of FIG. 3. It is noted that to the extent that elements of system 1700 are labeled with element numerals but are not described below, the descriptions of such elements appearing above, for example in the descriptions of FIGS. 1 and 3, shall apply to those elements of FIG. 17.

In the example shown, active feedforward loop 1704 is configured to impart a delay into a voltage feedback signal 1708, here from voltage signal device 103 operatively connected to filter 40, so that a difference, or error, occurs within difference unit 102 of impedance current regulator 106 as between the feedback voltage signal and a delayed version of the voltage feedback signal provided by active feedforward loop to provide an active feedforward voltage signal 1704D. Gain 104 of impedance current regulator 106 is necessarily only on a fast/short term basis in order to keep system 1700 stable under both grid-connected and island conditions. Consequently, the amplitude of the feedforward voltage should match the amplitude of the voltage feedback but with a short-term delay. Active feedforward loop 1704 is configured to provide this delay.

In one example, the delay imparted by active feedforward loop 1704 is equal to one electrical cycle or about one cycle. In some instantiations of system 1700 tested, a delay of about one cycle provided a desired response. In those instantiations, it typically took about one electrical cycle for impedance current regulator 106 to react to the disturbances and keep the currents within limits. However, the delay can have a magnitude other than about one electrical cycle. Generally, there is no limit on the maximum magnitude of delay. Rather, a consideration is that the longer the delay, the longer it takes for the voltage term to correct and eliminate the extra current, thus making it more likely that the current limits and/or other protection/alarms will be exceeded. However, the acceptable maximum magnitude of the delay will depend on how the alarms and/or protections are coordinated. Generally, the delay imparted by active feedforward loop 1704 can be as short as practicable, i.e., as long as it still results in enough error during the disturbances to keep system 1700 stable.

Figure 18:
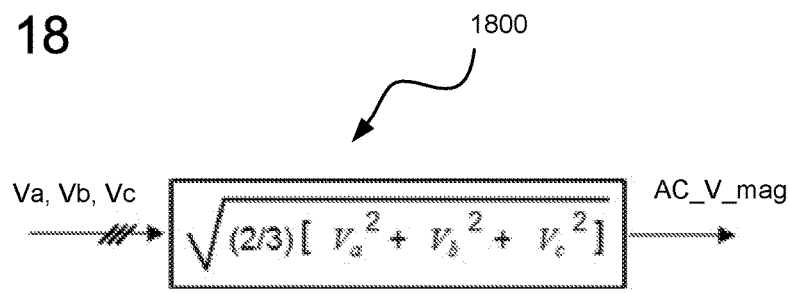
FIG. 18 is a diagram illustrating an example three-phase voltage amplitude calculator that can be used in the active feedforward loop of the control system of FIG. 17.

In the example shown, active feedforward loop 1704 includes a voltage amplitude calculator 1712 that estimates the magnitude of voltage feedback signal 1708 on an instantaneous basis; the delay in this example is provided by an additional delay element 1716, as described below. Voltage amplitude calculator 1712 may be any suitable voltage amplitude calculator that is appropriate for the number of phases at issue. FIG. 18 illustrates an example voltage amplitude calculator 1800 that can be used for voltage amplitude calculator 1712 of FIG. 17 for a three-phase system. As seen in FIG. 18, voltage amplitude calculator 1800 calculates a voltage amplitude signal, AC_V_mag based on measured instantaneous voltages, Va, Vb, Vc, of the three phases as the square root of the sum of the squares of three instantaneous voltage measurements multiplied by two-thirds. Those skilled in the art will readily appreciate that other voltage calculators can be used. For a single-phase implementation, voltage amplitude calculator 1712 (FIG. 17) need not be used, and the voltage amplitude signal AC_V_mag may simply be the measured instantaneous amplitude of voltage feedback signal.

Figure 19:
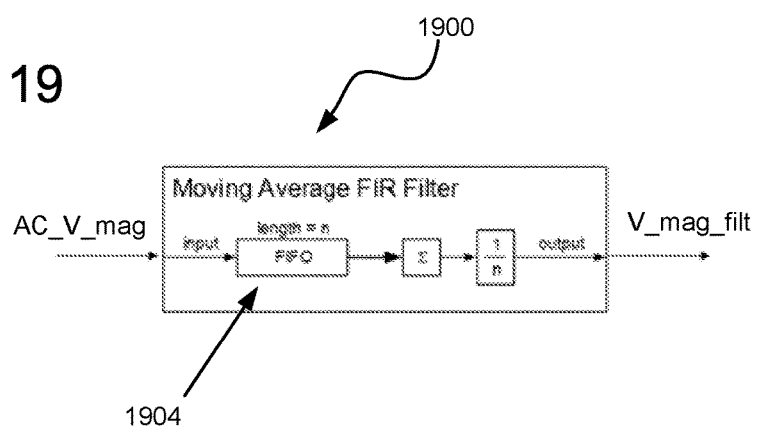
FIG. 19 is a diagram illustrating an example finite-impulse-response filter that can be used in the active feedforward loop of the control system of FIG. 17.

Referring again to FIG. 17, delay element 1716 may be any suitable delay element or set of elements that imparts the desired delay to delayed feedback voltage signal 1704D. In one example, delay element 1716 is instantiated as a filter, such as a finite impulse response (FIR) filter, for example, a moving average filter. FIG. 19 illustrates an example moving-average filter 1900 that can be used as delay element 1716 of FIG. 17. As seen in FIG. 19, moving-average filter 1900 utilizes a first-in-first-out (FIFO) queue 1904 having an equal tap length of 1/n to receive the voltage amplitude signal AC_V_mag. Moving-average filter 1900 outputs a filtered, and delayed, voltage feedback signal V_mag_filt (which in the example is active feedforward voltage signal 1704D). In one example, moving-average filter 1900 is designed to provide a delay of about a one electrical cycle so that active feedforward voltage signal V_mag_filt (1704D) is delayed by about one electrical cycle relative to voltage feedback signal 1708. However, in other embodiments, the magnitude of the delay may be different as described above. Referring back to FIG. 17, active feedforward voltage signal V_mag_filt (1704D) is provided to multiplier 70, which multiples the active feedforward voltage signal by a sine waveform from PLL 80 in a manner similar to the manner described above for the output of AC voltage amplitude signal source 60 of FIG. 3. Those skilled in the art will readily understand that moving average filter 1900 of FIG. 19 is but one example of a variety of FIR filters that can be used for delay element 1716 of active feedforward loop 1704 of FIG. 17 and, further, that FIR filters are but one type of delay element that can be used.

Referring again to FIG. 17, system 1700 includes an optional current imbalance feedback system 1720 that, among other things, detunes gain 104 of impedance current regulator 106 for multiphase systems as a function of imbalance among the phases in the multiphase system. Depending on the magnitude of gain 104, impedance current regulator 106 can be a strong balanced voltage source. However, in cases where the connection to AC power network 24 has significant imbalance among the phases, gain 104 can also contribute excessive imbalance currents beyond the capabilities of controlled current source 128, or a power converter more generally. Such connection imbalances may occur, for example, in steady state operation or during voltage sags or swells caused by faults on AC power network 24. To address this, current imbalance feedback system 1720 may be designed and configured to de-rate the current limits as well as detune gain 104 based on measurements that indicate the level of imbalance on AC power network 24.

Figure 20:
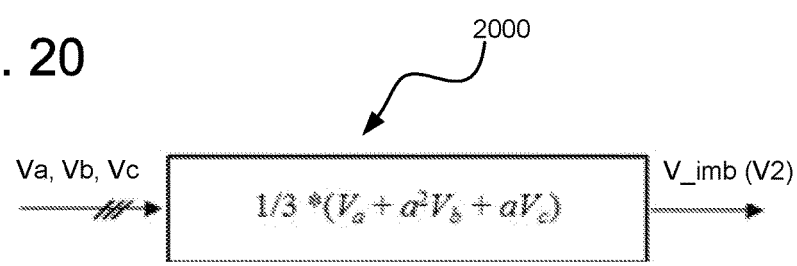
FIG. 20 is a diagram illustrating an example three-phase imbalance calculator that can be used in the current imbalance feedback system of FIG. 17.

In the example shown, current imbalance feedback system 1720 includes a phase imbalance calculator 1724 that calculates the level of phase imbalance on AC power network 24. The phase imbalance can be in terms of current or voltage, with the corresponding measurements being of any suitable type, such as voltage imbalance, negative sequence voltage, and negative sequence current, among others. FIG. 20 illustrates an example negative sequence type phase imbalance calculator 2000 that can be used as phase imbalance calculator 1724 of current imbalance feedback system 1720 of FIG. 17. In this example, the inputs to phase imbalance calculator 2000 are the same instantaneous voltage signals Va, Vb, Vc, measured at filter 40 (FIG. 17), and the output is a calculated voltage imbalance signal V_imb. Those skilled in the art will readily understand from the known methodology of symmetrical components that a and $a^2$ correspond, respectively, to 120-degree and 240-degree phase shifts.

As noted above, the phase imbalance can be determined in terms of current rather than voltage and can be determined in a manner other than using a negative sequence method. If current is used in lieu of voltage, system 1700 may include a current-measuring device (not shown) to measure the amplitudes of the phase currents output by controlled current source 128. In that case, the output of imbalance calculator 1724 would be a calculated current imbalance signal I_imb (not shown).

Referring again to FIG. 17, current imbalance feedback system 1720 also includes a gain control 1728 and a current-limit control 1732 that utilizes an imbalance signal (e.g., voltage imbalance signal V_imb, current imbalance signal I_imb, or other imbalance signal) to determine, respectively, an effective real output resistance R signal for providing to gain 104 of impedance current regulator 106 and a current limit signal, for example, a total current limit signal I_total=sqrt (Ireal^2+Ireactive^2). In this embodiment, current imbalance feedback system 1720 also includes a current limiter block 1736 that uses the current limit signal from current-limit control 1732 to determine each of a real current amplitude signal and a reactive current amplitude signal. As those skilled in the art will readily appreciate, in addition to using the current limit signal from current-limit control, current limiter block 1736 may also use any one or more of other limits, calculations, and prioritizations, among other things, to determine suitable real and reactive current amplitude signals, which are provided, respectively, to multipliers 72, 74 in the example shown. As those skilled in the art will also readily understand, each of gain and current-limit controls 1728 and 1732 may correlate the input, i.e., voltage imbalance signal V_imb (or current imbalance signal I_imb), to the output, i.e., either effective real output resistance R signal or current limit signal, using any suitable approach, such as using polynomial equations or control tables. The parameters implemented in each of gain and current-limit controls 1728 and 1732 must be carefully tuned to achieve the desired performance goals, which can include keeping the output current of controlled current source 128 within its capabilities while at the same time being able to supply as much islanded load as possible, as well as providing, to the extent possible, a balanced three-phase source for the islanded load.

While the foregoing examples are described in the general context of system 20a of FIG. 3, it should be understood that the broad features of providing a power converter with an active feedforward loop and/or a current imbalance feedback system can be implemented in other power converter systems, such as systems 20, 20b, 20e, 20f, 20g, 20h, and 20i of FIGS. 1, 3, 4, and 7-11, respectively, among others. Those skilled in the art will readily understand how to modify active feedforward loop 1704 and current imbalance feedback system 1720 to suit other applications and/or to accommodate functional elements (such as a voltage amplitude calculator, delay element, imbalance calculator, gain control, and current-limit control) that are alternatives to the functional elements illustrated in the examples.

Example Computing System

It is to be noted that any one or more of the aspects and embodiments described herein may be conveniently implemented in and/or using one or more machines (e.g., one or more computers, one or more communications network devices, one or more electrical distribution network devices, any combination and/or network thereof, among other things) programmed according to the teachings of the present specification, as will be apparent to those of ordinary skill in the computer arts. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, a laptop computer, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 21:
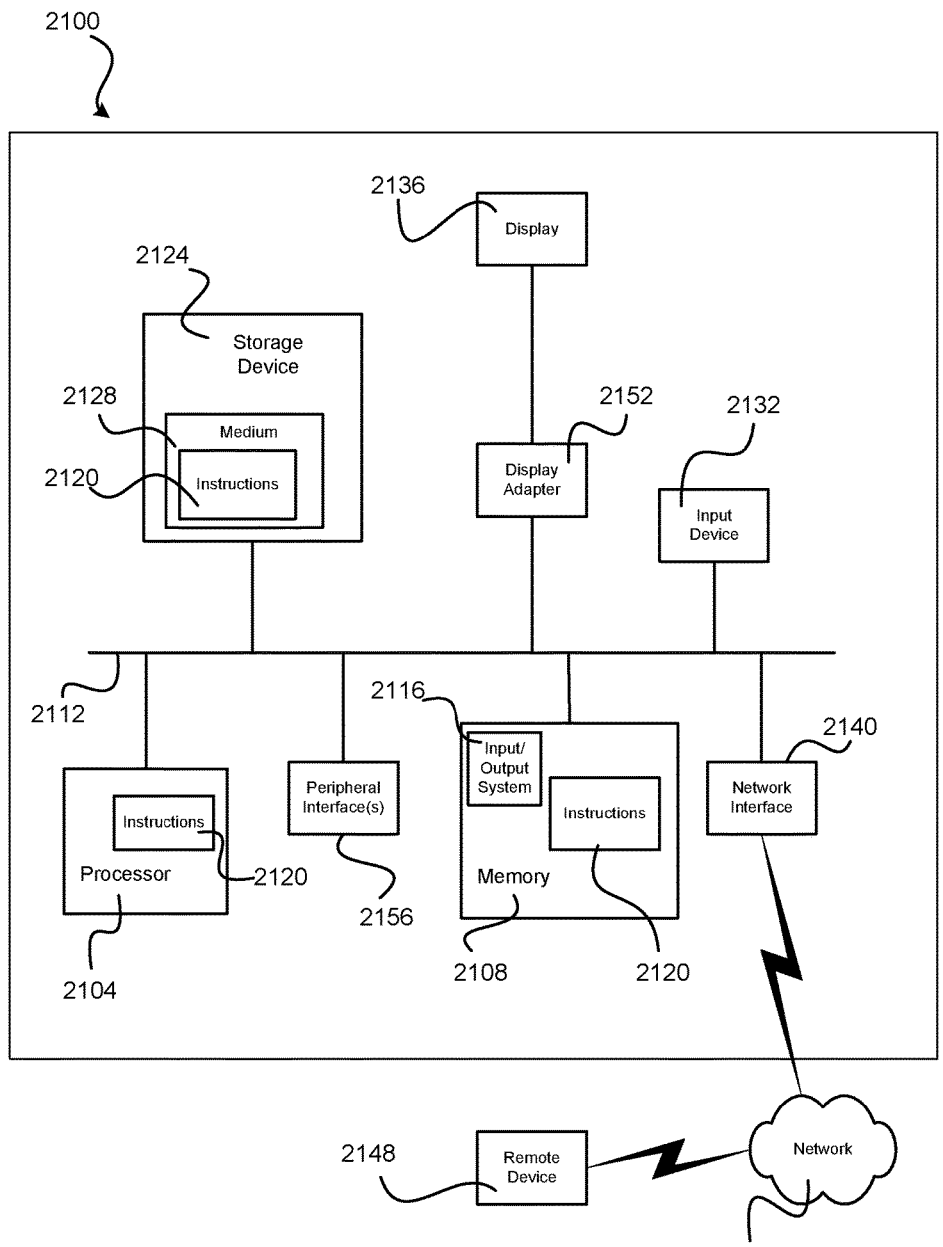
FIG. 21 is a high-level schematic diagram of an example computing system that can be used to implement any software of the present disclosure.

FIG. 21 shows a diagrammatic representation of one embodiment of a computing device in the example form of a computer system 2100 within which a set of instructions for performing any one or more of the aspects and/or methodologies of the present disclosure may be executed. It is also contemplated that multiple computing devices may be utilized to implement a specially configured set of instructions for causing one or more of the devices to contain and/or perform any one or more of the aspects and/or methodologies of the present disclosure. Computer system 2100 includes a processor 2104 and a memory 2108 that communicate with each other, and with other components, via a bus 2112. Bus 2112 may include any of several types of bus structures including, but not limited to, a memory bus, a memory controller, a peripheral bus, a local bus, and any combinations thereof, using any of a variety of bus architectures.

Memory 2108 may include various components (e.g., machine-readable media) including, but not limited to, a random access memory component, a read only component, and any combinations thereof. In one example, a basic input/output system 2116 (BIOS), including basic routines that help to transfer information between elements within computer system 2100, such as during start-up, may be stored in memory 2108. Memory 2108 may also include (e.g., stored on one or more machine-readable media) instructions (e.g., software) 2120 embodying any one or more of the aspects and/or methodologies of the present disclosure. In another example, memory 2108 may further include any number of types of software, including, but not limited to, an operating system, one or more application programs, other program modules, program data, and any combinations thereof.

Computer system 2100 may also include a storage device 2124. Examples of a storage device (e.g., storage device 2124) include, but are not limited to, a hard disk drive, a magnetic disk drive, an optical disc drive in combination with an optical medium, a solid-state memory device, and any combinations thereof. Storage device 2124 may be connected to bus 2112 by an appropriate interface (not shown). Example interfaces include, but are not limited to, SCSI, advanced technology attachment A(TA), serial ATA, universal serial bus U(SB), IEEE 2194 (FIREWIRE), and any combinations thereof. In one example, storage device 2124 (or one or more components thereof) may be removably interfaced with computer system 2100 (e.g., via an external port connector (not shown)). Particularly, storage device 2124 and an associated machine-readable medium 2128 may provide nonvolatile and/or volatile storage of machine-readable instructions, data structures, program modules, and/or other data for computer system 2100. In one example, software 2120 may reside, completely or partially, within machine-readable medium 2128. In another example, software 2120 may reside, completely or partially, within processor 2104.

Computer system 2100 may also include an input device 2132. In one example, a user of computer system 2100 may enter commands and/or other information into computer system 2100 via input device 2132. Examples of an input device 2132 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 2132 may be interfaced to bus 2112 via any of a variety of interfaces (not shown) including, but not limited to, a serial interface, a parallel interface, a game port, a USB interface, a FIREWIRE interface, a direct interface to bus 2112, and any combinations thereof. Input device 2132 may include a touch screen interface that may be a part of or separate from display 2136, discussed further below. Input device 2132 may be utilized as a user selection device for selecting one or more graphical representations in a graphical interface as described above.

A user may also input commands and/or other information to computer system 2100 via storage device 2124 (e.g., a removable disk drive, a flash drive, etc.) and/or network interface device 2140. A network interface device, such as network interface device 2140, may be utilized for connecting computer system 2100 to one or more of a variety of networks, such as network 2144, and one or more remote devices 2148 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 2144, may employ a wired and/or a wireless mode of communication. In general, any network topology may be used. Information (e.g., data, software 2120, etc.) may be communicated to and/or from computer system 2100 via network interface device 2140.

Computer system 2100 may further include a video display adapter 2152 for communicating a displayable image to a display device, such as display device 2136. Examples of a display device include, but are not limited to, a liquid crystal display (LCD), a cathode ray tube (CRT), a plasma display, a light emitting diode (LED) display, and any combinations thereof. Display adapter 2152 and display device 2136 may be utilized in combination with processor 2104 to provide graphical representations of aspects of the present disclosure. In addition to a display device, computer system 2100 may include one or more other peripheral output devices including, but not limited to, an audio speaker, a printer, and any combinations thereof. Such peripheral output devices may be connected to bus 2112 via a peripheral interface 2156. Examples of a peripheral interface include, but are not limited to, a serial port, a USB connection, a FIREWIRE connection, a parallel connection, and any combinations thereof.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A control system for a controlled current source that receives DC power as an energy input and provides an AC power output for delivery to an AC power network, the AC power output having an output voltage, the control system comprising:
   a voltage signal device, connectable to the controlled current source, configured to provide a voltage feedback signal representing voltage in the AC power output from the controlled current source;
   an active feedforward loop electrically connected to the voltage signal device, the active feedforward loop configured to generate an active feedforward voltage signal based on the voltage feedback signal; and
   an impedance current regulator configured to generate an impedance current signal as a function of an error between the voltage feedback signal and the active feedforward voltage signal.

2. The control system according to claim 1, wherein the active feedforward loop includes a voltage amplitude calculator that generates a voltage amplitude signal based on the voltage feedback signal.

3. The control system according to claim 2, wherein the voltage feedback signal contains three voltage signals, and the voltage amplitude calculator generates the voltage amplitude signal based on the square root of a sum of the squares of the three voltage signals.

4. The control system according to claim 1, wherein the active feedforward loop is configured to generate the active feedforward voltage signal so that it has a delay selected as a function of at least one current limit of the controlled current source.

5. The control system according to claim 4, wherein the delay is about one electrical cycle relative to the voltage feedback signal.

6. The control system according to claim 1, wherein the active feedforward loop includes a filter that generates the active feedforward voltage signal so that it has a delay relative to the voltage feedback signal.

7. The control system according to claim 6, wherein the filter comprises a moving average filter.

8. The control system according to claim 6, wherein the active feedforward loop further includes a voltage amplitude calculator that generates a voltage amplitude signal based on the voltage feedback signal.

9. The control system according to claim 1, wherein:
   the impedance current regulator includes a gain that is a function of a voltage output of the controlled current source and a current output of the controlled current source;
   the AC power output from the controlled current source is an output containing multiple phases; and
   the control system further includes a current imbalance feedback system that detunes the gain as a function of imbalance among the multiple phases.

10. The control system according to claim 9, wherein the current imbalance feedback system includes an imbalance calculator that generates an imbalance signal based on the multiple phases of the AC power output.

11. The control system according to claim 10, wherein the imbalance calculator is a voltage imbalance calculator that generates a voltage imbalance signal based on the voltage feedback signal from the voltage signal device.

12. The control system according to claim 11, wherein the current imbalance feedback system includes a current-limit control that generates each of a real current amplitude limit signal and a reactive current amplitude limit signal as a function of the voltage imbalance signal.

13. The control system according to claim 10, wherein the imbalance calculator is a current imbalance calculator that generates a current imbalance signal as a function of a current feedback signal based on the AC power output of the controlled current source.

14. The control system according to claim 10, wherein the gain is based on a resistance, and the current imbalance feedback system includes a gain control that calculates the resistance as a function of the imbalance signal.

15. The control system according to claim 10, wherein the current imbalance feedback system includes a current-limit control that generates each of a real current amplitude limit signal and a reactive current amplitude limit signal as a function of the imbalance signal.

16. A method of controlling a controlled current source that receives DC power as an energy input and provides an AC power output for delivery to an AC power network, the AC power output having an output voltage, the method comprising:
   receiving a voltage feedback signal representing voltage in the AC power output from the controlled current source;
   generating an active feedforward voltage signal based on the voltage feedback signal;
   determining an error between the voltage feedback signal and the active feedforward voltage signal;
   generating an impedance current signal as a function of the error between the voltage feedback signal and the active feedforward voltage signal; and
   controlling the controlled current source as a function of the impedance current signal.

17. The method according to claim 16, wherein the three-phase output has three-phase voltage signals and generating an active feedforward voltage signal includes calculating a voltage amplitude signal based on the three-phase voltage signals.

18. The method according to claim 17, wherein calculating a voltage amplitude signal includes calculating the voltage amplitude signal based on the square root of a sum of the squares of the three voltage signals.

19. The method according to claim 16, wherein generating an active feedforward voltage signal includes generating an active feedforward voltage signal having a delay of at least one electrical cycle relative to the voltage feedback signal.

20. The method according to claim 19, wherein the delay is substantially one electrical cycle relative to the voltage feedback signal.

21. The method according to claim 16, wherein generating an active feedforward voltage signal includes applying a filter so that the active feedforward voltage signal has a delay relative to the voltage feedback signal.

22. The method according to claim 21, wherein applying a filter includes applying a moving average filter.

23. The method according to claim 21, wherein the feedback voltage signal has three-phase voltage signals and generating an active feedforward voltage signal includes calculating a voltage amplitude signal based on the three-phase voltage signals.

24. The method according to claim 16, wherein:
   the impedance current regulator includes a gain that is a function of a voltage output of the controlled current source and a current output of the controlled current source;

the AC power output from the controlled current source is an output containing multiple phases; and the method includes detuning the gain as a function of imbalance among the multiple phases.

25. The method according to claim 24, wherein detuning the gain includes calculating an imbalance level based on the multiple phases of the AC power output.

26. The method according to claim 25, wherein calculating an imbalance level includes calculating a voltage imbalance signal based on the voltage feedback signal.

27. The method according to claim 26, further comprising determining each of a real current amplitude limit signal and a reactive current amplitude limit signal as a function of the voltage imbalance signal.

28. The method according to claim 25, wherein calculating an imbalance level includes calculating a current imbalance that generates a current imbalance signal as a function of a current feedback signal based on the AC power output.

29. The method according to claim 25, wherein the gain is based on a resistance, and the method further includes determining the resistance as a function of the imbalance level.

30. The method according to claim 25, further comprising determining each of a real current amplitude limit signal and a reactive current amplitude limit signal as a function of the imbalance level.

* * * * *